(12) United States Patent
Pyo

(10) Patent No.: US 11,439,030 B2
(45) Date of Patent: Sep. 6, 2022

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 7 days.

(21) Appl. No.: 17/100,637

(22) Filed: Nov. 20, 2020

(65) Prior Publication Data

US 2021/0161023 A1 May 27, 2021

(30) Foreign Application Priority Data

Nov. 21, 2019 (KR) .......................... 10-2019-0150452

(51) Int. Cl.
*H05K 7/02* (2006.01)
*H05K 7/04* (2006.01)
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
USPC .......................... 361/728, 755, 807, 809, 810
See application file for complete search history.

(56) References Cited

U.S. PATENT DOCUMENTS

| 11,229,128 B2* | 1/2022 | Kim ..................... H05K 5/0217 |
| 2017/0161868 A1* | 6/2017 | Kim ..................... H05K 5/0017 |
| 2017/0196102 A1* | 7/2017 | Shin ...................... H05K 1/111 |
| 2018/0017994 A1* | 1/2018 | Xu ......................... G06F 1/1652 |

FOREIGN PATENT DOCUMENTS

| KR | 20-0435387 | 1/2007 |
| KR | 10-2017-0006013 | 1/2017 |
| KR | 10-2017-0066838 | 6/2017 |
| KR | 10-2017-0081347 | 7/2017 |

OTHER PUBLICATIONS

PCT International Application No. PCT/KR2020/014028, International Search Report dated Feb. 16, 2021, 3 pages.
Antonio Gomes, et al., "MagicScroll: A Rollable Display Device with Flexible Screen Real Estate and Gestural Input," MobileHCI'18, pp. 1-11, Sep. 2018, 11 pages.

* cited by examiner

*Primary Examiner* — Hung S. Bui
(74) *Attorney, Agent, or Firm* — Lee, Hong, Degerman, Kang & Waimey PC

(57) ABSTRACT

A display device is disclosed. The display device includes a flexible display panel, a panel roller, a first pipe extending in a longitudinal direction of the panel roller, wherein the first pipe is located adjacent to the panel roller, a second pipe extending in the longitudinal direction of the panel roller and located adjacent to the panel roller, a third pipe extending in the longitudinal direction of the panel roller and located adjacent to the panel roller, the first pipe and the second pipe, a guide roller extending in the longitudinal direction of the panel roller and located opposite to the third pipe with respect to the panel roller, and a correction unit located at the first pipe and comprising a correction roller rotatable on the first pipe and a roll plate curved that is perpendicular to a longitudinal direction of the panel roller.

10 Claims, 40 Drawing Sheets

FIG. 5
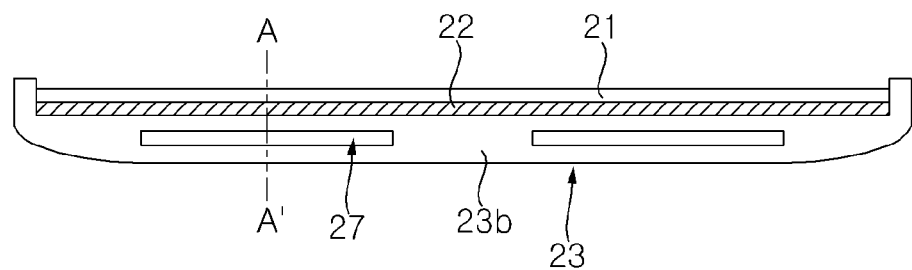
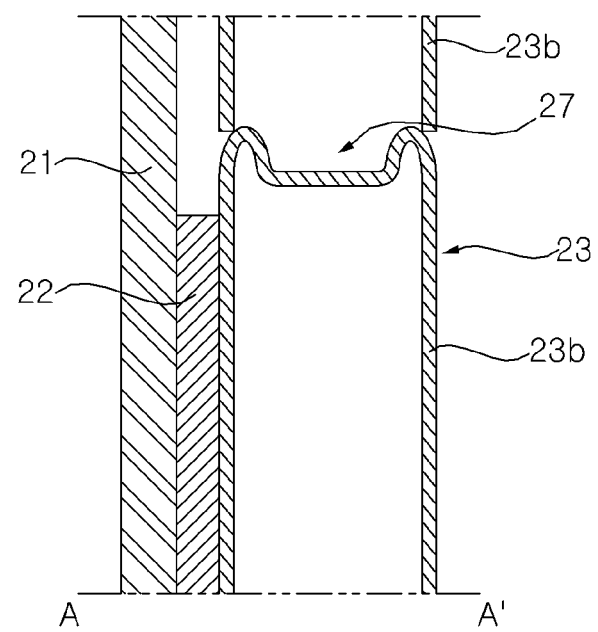

FIG. 7
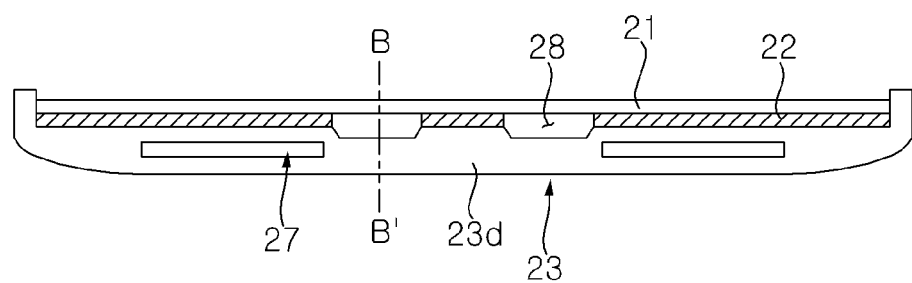
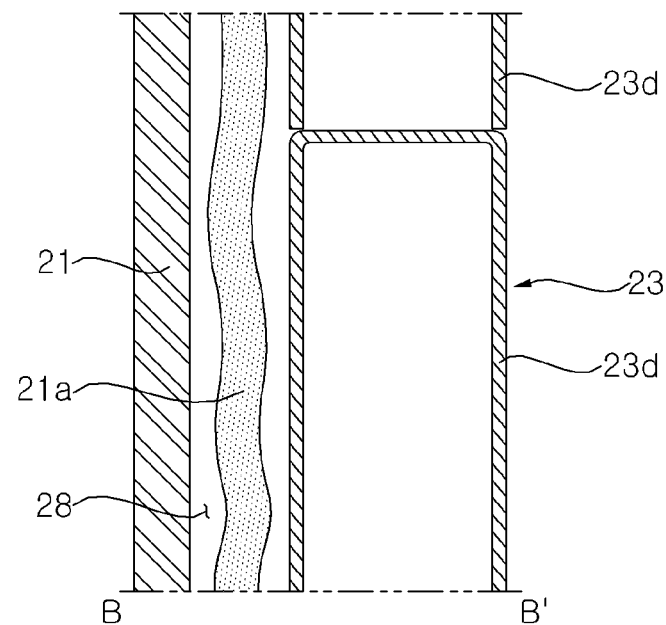

FIG. 8
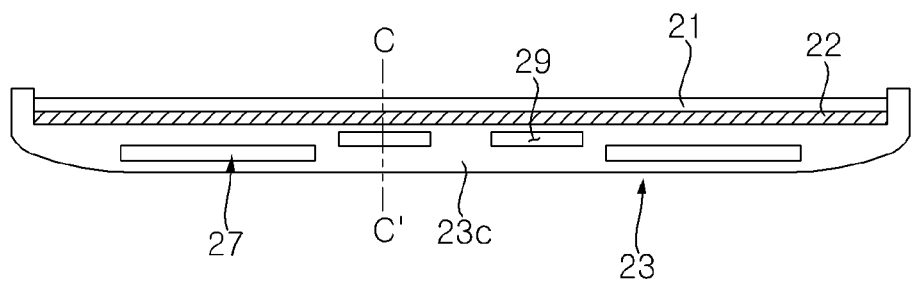
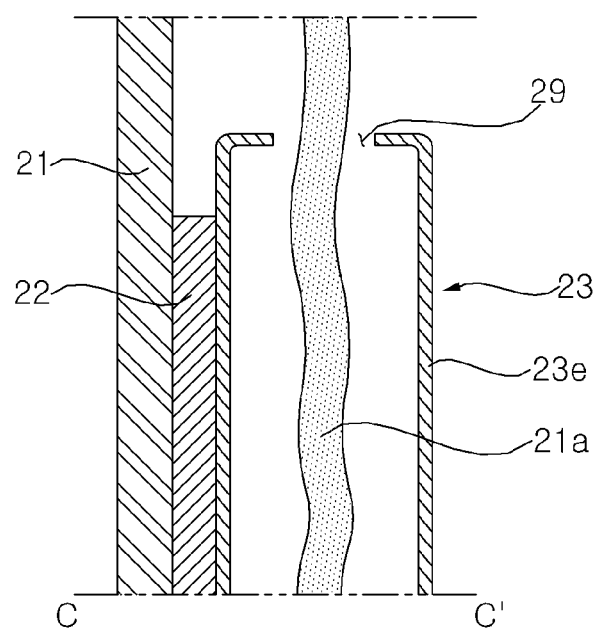

DISPLAY DEVICE

CROSS-REFERENCE TO RELATED APPLICATION

Pursuant to 35 U.S.C. § 119(a), this application claims the benefit of earlier filing date and right of priority to Korean Patent Application No. 10-2019-0150452 filed on Nov. 21, 2019, the contents of which are hereby incorporated by reference herein in its entirety.

BACKGROUND OF THE INVENTION

1. Field of the Invention

The present disclosure relates to a display device.

2. Description of the Related Art

As the information society has developed, the demand for display devices is increasing in various forms, and accordingly, in recent years, various display devices such as a liquid crystal display (LCD), plasma display panel (PDP), electroluminescent display (ELD), vacuum fluorescent display (VFD), and the like have been studied and used.

Thereamong, a display device using an organic light emitting diode (OLED) has excellent luminance and viewing angle characteristics in comparison with a liquid crystal display device and does not require a backlight unit, thereby being implemented in an ultrathin type.

In addition, a flexible display panel can be bent or wound around a roller. The flexible display panel may be used to implement a display device that unfolds on a roller or winds around the roller. Many studies have been made on a structure for winding a flexible display panel around a roller or unwinding the flexible display panel from the roller.

SUMMARY OF THE INVENTION

It is an object of the present disclosure to solve the above and other problems.

It is another object of the present disclosure to secure structural rigidity for preventing drooping of a display device.

It is another object of the present disclosure to secure structural rigidity for preventing twisting of the display device.

It is a further object of the present disclosure to prevent bending of a flexible display panel.

In accordance with the present disclosure, the above and other objects can be accomplished by the provision of a display device including a flexible display panel, a panel roller, wherein the flexible display panel is wound around or unwound from the panel roller, a first pipe extending in a longitudinal direction of the panel roller, wherein the first pipe is located adjacent to the panel roller, a second pipe extending in the longitudinal direction of the panel roller, wherein the second pipe is located adjacent to the panel roller and is located opposite to the first pipe with respect to the panel roller, a third pipe extending in the longitudinal direction of the panel roller, wherein the third pipe is located adjacent to the panel roller, the first pipe and the second pipe, a guide roller extending in the longitudinal direction of the panel roller, wherein the guide roller is located opposite to the third pipe with respect to the panel roller, and a correction unit located at the first pipe and comprising a correction roller rotatable on the first pipe and a roll plate curved that is perpendicular to a longitudinal direction of the panel roller such that the roll plate is wound around or unwound from the correction roller, wherein the flexible display panel is wound around or unwound from the panel roller such that the flexible display panel passes between the first pipe and the guide roller, and wherein the roll plate is adjacent to and fixed to a lower end of the flexible display panel.

BRIEF DESCRIPTION OF THE DRAWINGS

The above and other objects, features and other advantages of the present disclosure will be more clearly understood from the following detailed description taken in conjunction with the accompanying drawings, in which:

FIGS. 1 to 40 are views showing examples of a display device according to embodiments of the present disclosure.

DETAILED DESCRIPTION OF THE PREFERRED EMBODIMENTS

Figure 1:
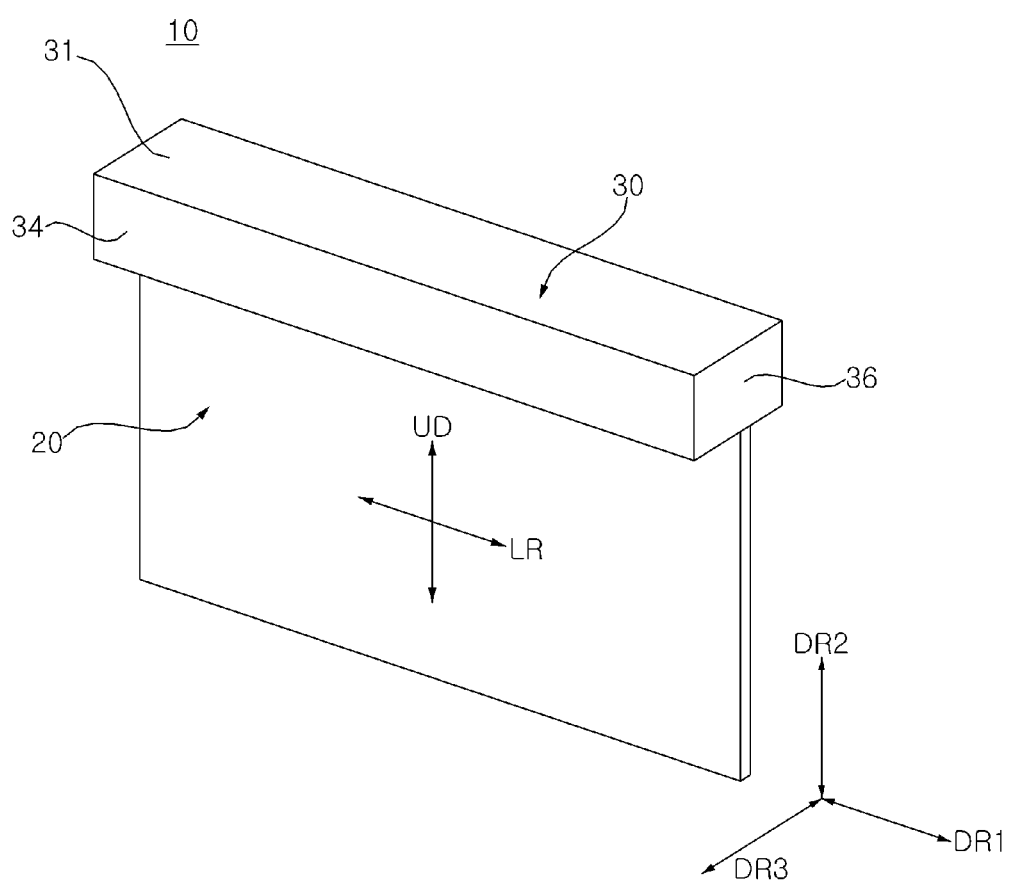

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another. It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIG. 1, a display device 10 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

The direction parallel to the longitudinal direction of the housing 30 may be referred to as a first direction DR1, a leftward direction, or a rightward direction. The direction in which the display unit 20 displays a screen may be referred to as a forward direction or the front. The direction opposite to the direction in which the display unit 20 displays the screen may be referred to as a rearward direction or the rear. The direction parallel to the height direction of the display device 10 may be referred to as a second direction DR2, an upward direction, or a downward direction.

A third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. A leftward-rightward direction LR may be parallel to the first direction DR1, and an upward-downward UD may be parallel to the second direction DR2.

Figure 2:
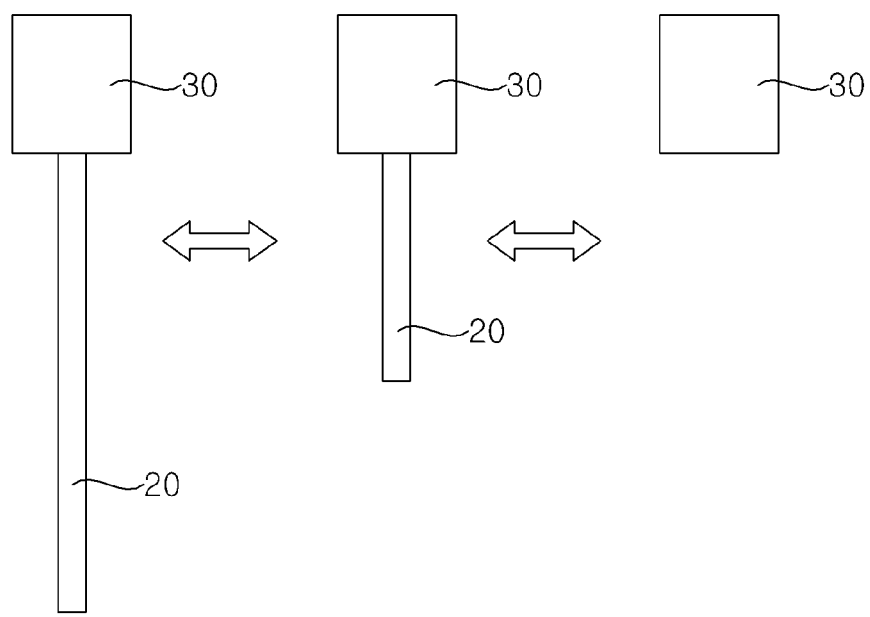

Referring to FIG. 2, the display unit 20 may be entirely located inside the housing 30. At least a portion of the display unit 20 may be located outside the housing 30. The degree to which the display unit 20 is exposed to the outside of the housing 30 may be adjusted as necessary.

Figure 3:
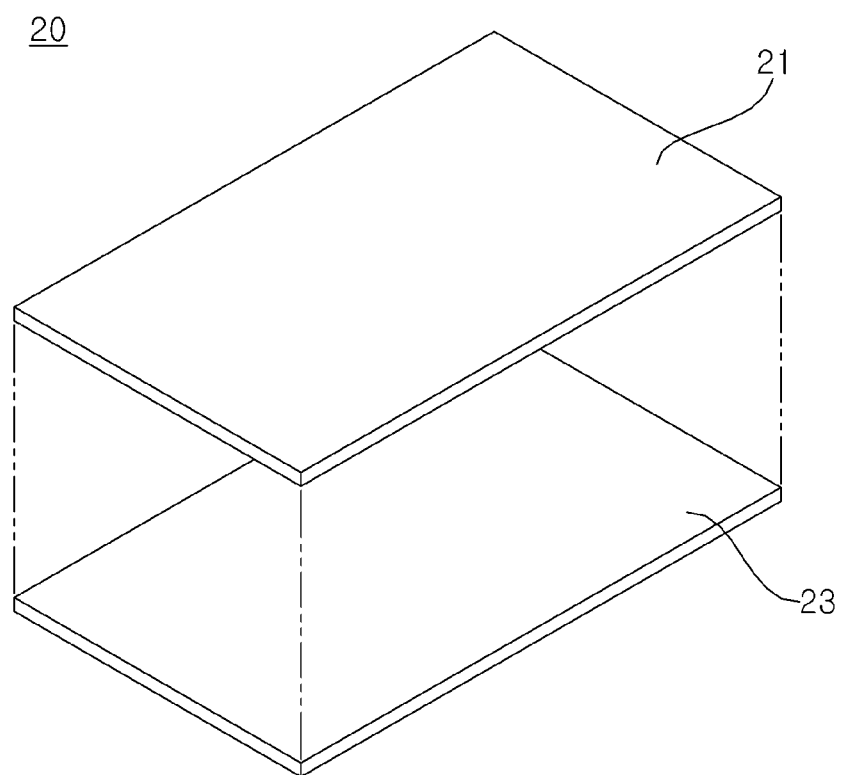

Referring to FIG. 3, the display unit 20 may include a display panel 21 and a plate 23. The display panel 21 may be flexible. For example, the display panel 21 may be an organic light emitting display (OLED).

The display panel 21 may have a front surface for displaying an image. The display panel 21 may have a rear surface facing the front surface. The front surface of the display panel 21 may be covered with a light transmissive material. For example, the light transmissive material may be a synthetic resin or film.

The plate 23 may be coupled, fastened, or attached to the rear surface of the display panel 21. The plate 23 may include a metal material. The plate 23 may be referred to as a module cover 23, a cover 23, a display panel cover 23, a panel cover 23, or an apron 23.

Figure 4:
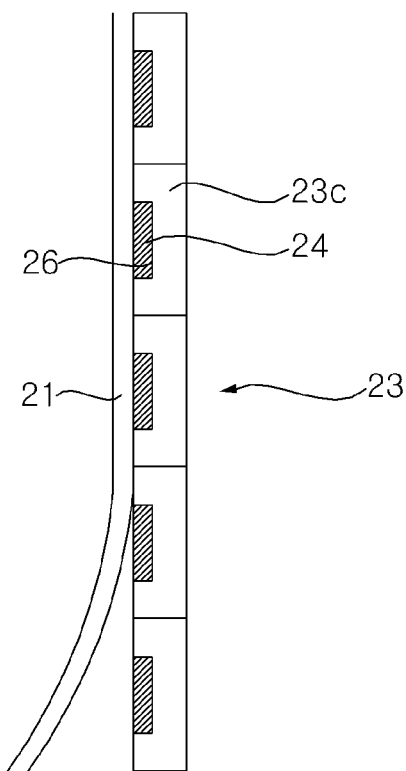

Referring to FIG. 4, the plate 23 may include a plurality of segments 23c. A magnet 24 may be located inside a recess 26 of the segment 15c. The recess 26 may be located on a surface of the segment 23c facing the display panel 21. The recess 26 may be located in the front surface of each segment 23. Since the magnet 24 is accommodated inside the recess 26, the magnet 24 may not protrude from the segment 23c. The display panel 21 may be flat without being wrinkled even when it is in contact with the segment 23c.

Referring to FIG. 5, a bead 27 may be formed in the upper surface of the segment 23b. The bead 27 may have a shape recessed inwardly of the segment 23b. For example, the bead 27 may be formed by pressing the segment 23b. A plurality of beads 27 may be formed on the segment 23b. The plurality of beads 27 may be spaced apart from each other. The bead 27 may enhance the rigidity of the segment 23b. The bead 27 can prevent the shape of the segment 23b from being deformed due to external impact. The segment 23b may be fixed to the rear of the display panel 21 via an adhesive member 22. For example, the adhesive member 22 may be double-sided tape.

Figure 6:
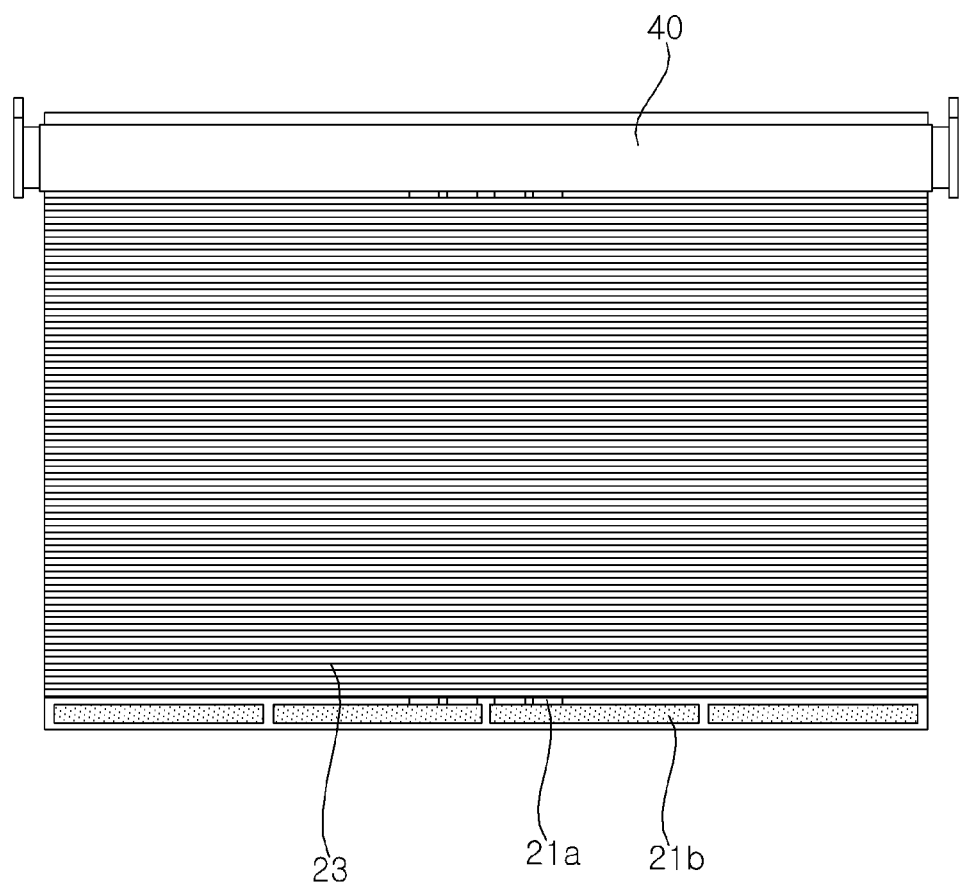

Referring to FIG. 6, a source PCB 21b may be located under the module cover 23. In the case of roll-down or roll-up, the position of the source PCB 21b may be changed with the movement of the module cover 23. An FFC cable 21a may be located in the central part of the module cover 23 based on the first direction. The FFC cable 21a may be located in both ends of the module cover 23 based on the first direction.

Referring to FIG. 7, a segment 23d may include a depression 28 recessed inwardly of the segment 23d. The depression 28 may form a space between the display panel 21 and the module cover 23. The FFC cable 21a may be accommodated in a space formed by the depression 28. In addition, the depression 28 may improve the rigidity of the segment 23d.

The bead 27 may be located on the segment 23d excluding a portion where the depression 28 is located. The position of the depression 28 may not overlap the position of the bead 27 in order to prevent a reduction in rigidity of the segment 23d.

Referring to FIG. 8, a penetrating portion 29 may be located at the central part of a segment 23e based on the first direction. The penetrating portion 29 may penetrate the central part of the segment 23e in the second direction. That is, the penetrating portion 29 may be a hole located in the segment 23e. The penetrating portion 29 may be a portion where the FFC cable 21a is located. Since the penetrating portion 29 is formed in the segment 23e, the thickness of the segment 23e may be reduced in comparison with the case where the FFC cable 21a is located in the depression 28 (see FIG. 7).

The bead 27 may be located on the segment 23e excluding a portion where the penetrating portion 29 is located. The position of the penetrating portion 29 may not overlap the position of the bead 27 in order to prevent a reduction in rigidity of the segment 23e.

Figure 9:
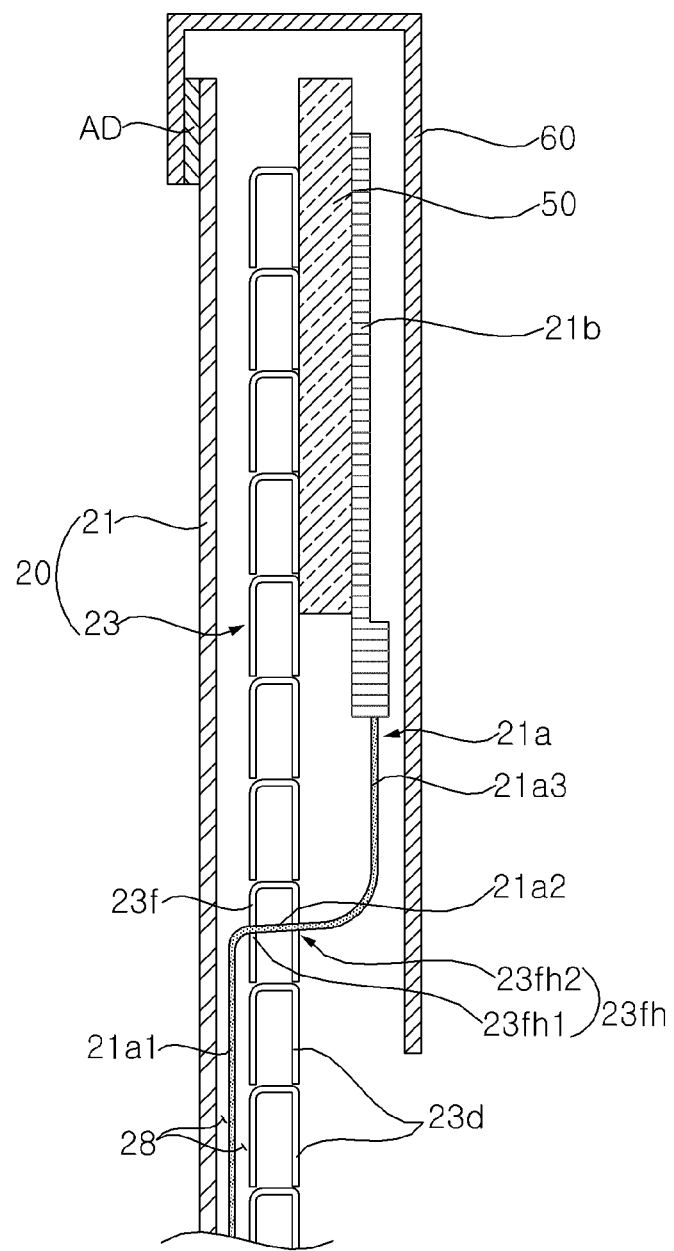

Referring to FIG. 9, a top case 60 may cover the source PCB 21b and an upper bar 50 as well as the display panel 21 and the module cover 23. One surface of the upper bar 50 may be coupled to the rear surface of the module cover 23, and the other surface thereof may be coupled to the source PCB 21b. The upper bar 50 may be fixed to the module cover 23 to support the source PCB 21b. The top case 60 may be referred to as a bottom case 60. The upper bar 50 may be referred to as a lower bar 50.

Figure 10:
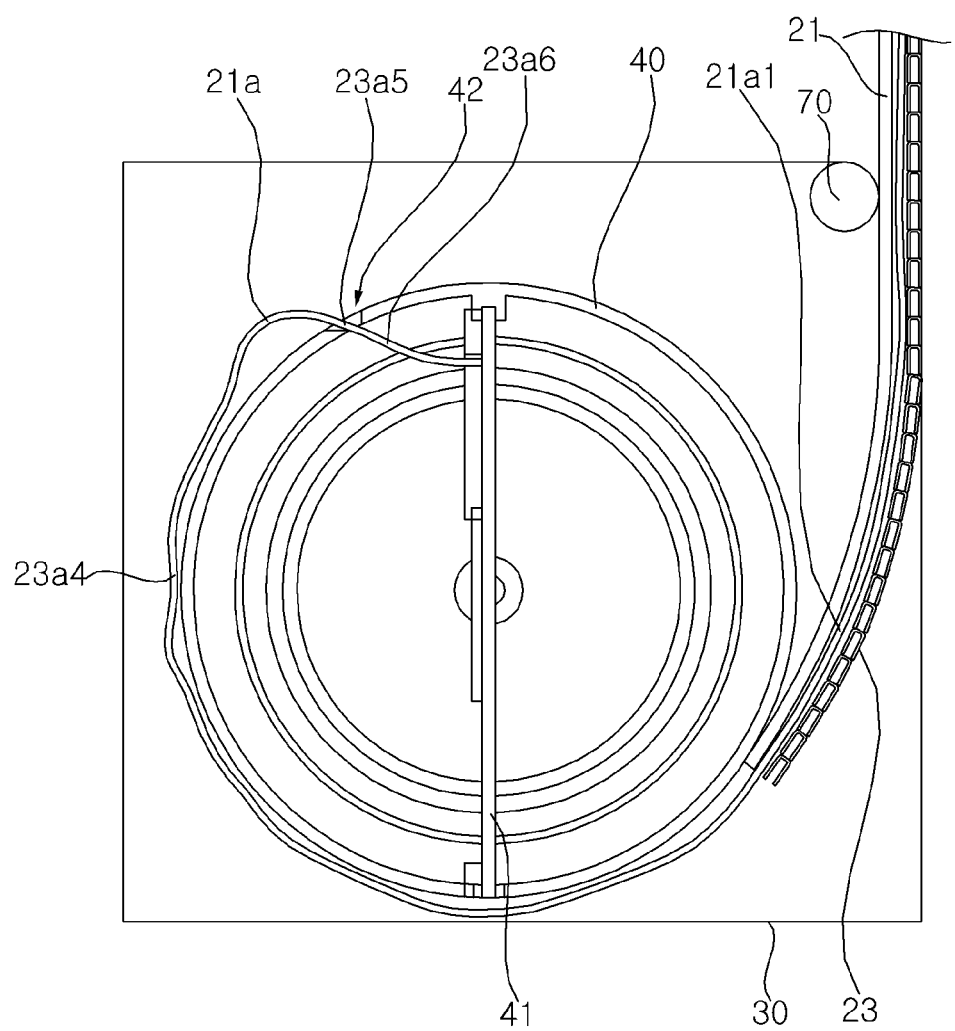

The lower end of the FFC cable 21a may be connected to a timing controller board 41 (see FIG. 10) inside a panel roller 40 (see FIG. 10). The FFC cable 21a may be wound around or unwound from the panel roller 40 together with the display unit 20.

A portion of the FFC cable 21a may be located between the display panel 21 and the module cover 23. The portion of the FFC cable 21a located between the display panel 21 and the module cover 23 may be referred to as a first portion 21a1. The first portion 21a1 may be located in the depression 28 formed by the plurality of segments 23d. Alternatively, the first portion 21a1 may be accommodated in the depression 28 formed by the plurality of segments 23d.

A portion of the FFC cable 21a may penetrate a segment 23f. The portion of the FFC cable 21a that passes through the segment 23f may be referred to as a second portion 21a2. The segment 23f may include a first hole 23fh1 formed in the front surface and a second hole 23fh2 formed in the rear surface. The first hole 23fh1 and the second hole 23fh2 may be connected to each other to form a single hole 23fh. The hole 23fh may penetrate the segment 23f in the third direction. The second portion 21a2 may extend through the hole 23fh. The hole 23fh may be referred to as a connection hole 23fh.

The upper end of the FFC cable 21a may be electrically connected to the source PCB 21b. A part of the FFC cable 21a may be located in the rear surface of the module cover 23. The portion of the FFC cable 21a located in the rear surface of the module cover 23 may be referred to as a third portion 21a3. The third portion 21a3 may be electrically connected to the source PCB 21b.

The third portion 21a3 may be covered by the top case 60. Accordingly, the third portion 21a3 may not be exposed to the outside.

Referring to FIG. 10, the FFC cable 21a may be connected to the timing controller board 41 mounted in the panel roller 40. A penetrating hole 42 may be formed on the panel roller 40, and the FFC cable 21a may be connected to the timing controller board 41 through the penetrating hole 42.

The penetrating hole 42 may be located in one side of the panel roller 40 and may penetrate an outer circumferential portion of the panel roller 40. The FFC cable 21a may be connected to one side of the timing controller board 41 through the penetrating hole 42.

Even when the FFC cable 21a is located in the outer circumference of the panel roller 40, it may maintain the connection with the timing controller board 41 due to the penetrating hole 42. Accordingly, the FFC cable 21a may rotate together with the panel roller 40 to prevent twisting.

A portion of the FFC cable 21a may be wound around the panel roller 40. The portion of the FFC cable 21a wound around the panel roller 40 may be referred to as a fourth portion 23a4. The fourth portion 23a4 may be in contact with the outer circumferential surface of the panel roller 40.

A portion of the FFC cable 21a may pass through the penetrating hole 42. The portion of the FFC cable 21a passing through the penetrating hole 42 may be referred to as a fifth portion 23a5.

The lower end of the FFC cable 21a may be electrically connected to the timing controller board 41. A portion of the FFC cable 21a may be located inside the panel roller 40. The portion of the FFC cable 21a located inside the panel roller 40 may be referred to as a sixth portion 23a6. The sixth portion 23a6 may be electrically connected to the timing controller board 41.

Figure 11:
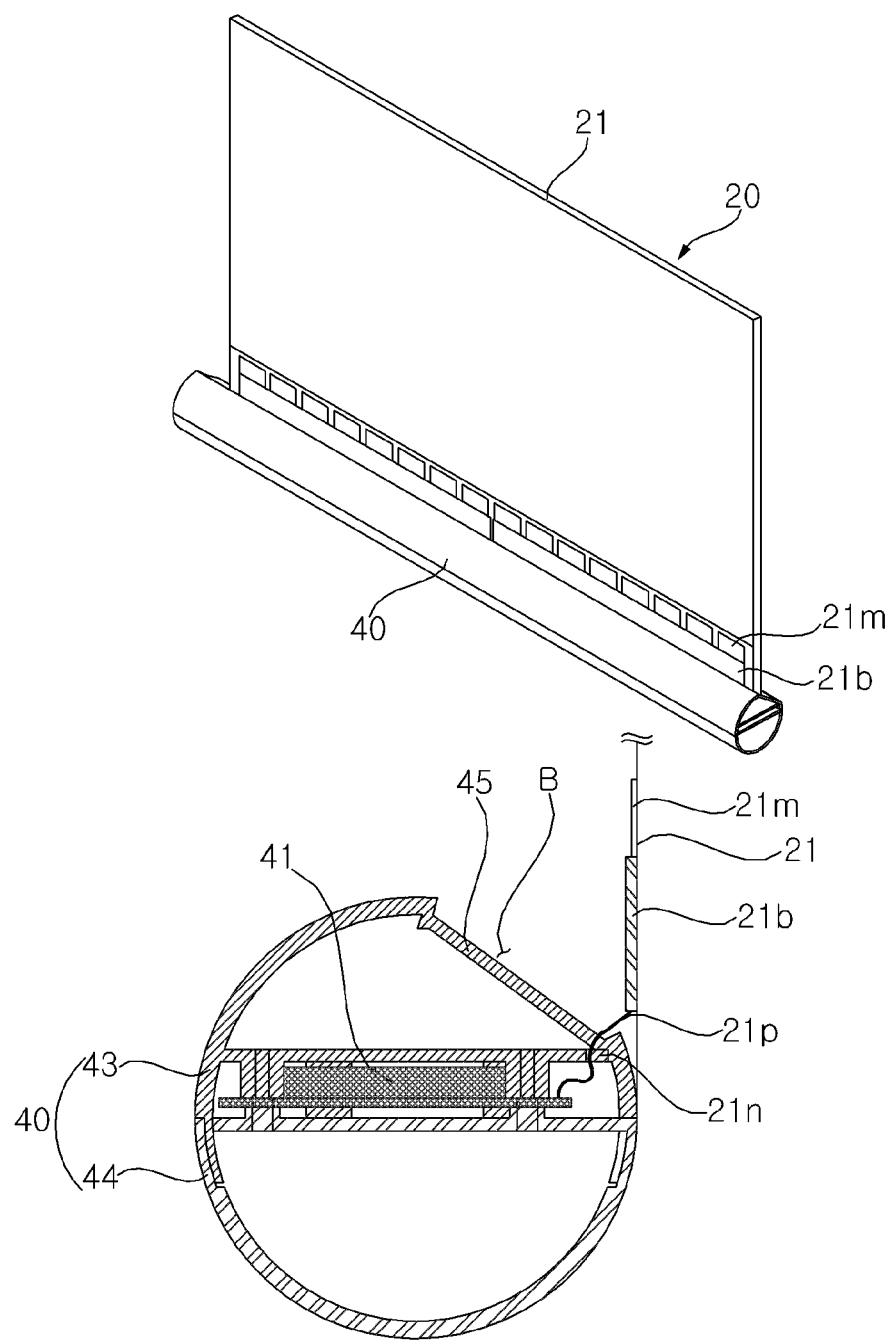

Referring to FIG. 11, the display panel 21 may be connected to the panel roller 40. The display panel 21 may be wound around or unwound from the panel roller 40. The display panel 21 may be electrically connected to the plurality of source PCBs 21b. The plurality of source PCBs 21b may be spaced apart from each other.

A source chip on film (COF) 21m may connect the display panel 21 and the source PCB 21b. The source COF 21M may be located at the lower side of the display panel 21. The panel roller 40 may include a first part 43 and a second part 44. The first part 43 and the second part 44 may be fastened by a screw. The timing controller board 41 may be mounted in the panel roller 40.

The source PCB 21b may be electrically connected to the timing controller board 41. The timing controller board 41 may send digital video data and a timing control signal to the source PCB 21b.

The cable 21p may electrically connect the source PCB 21b and the timing controller board 41. For example, the cable 21p may be a flexible flat cable (FFC). The cable 21p may penetrate a hole 21n. The hole 21n may be formed in a seating portion 45 or the first part 43. The cable 21p may be located between the display panel 21 and the second part 44.

The seating portion 45 may be formed in an outer circumference of the first part 43. The seating portion 45 may be formed by stepping a portion of the outer circumference of the first part 43. The seating portion 45 may form a space B. When the display unit 20 is wound around the panel roller 40, the source PCB 21b may be accommodated in the seating portion 45. Since the source PCB 21b is accommodated in the seating portion 45, the source PCB 21b may not be twisted or bent, and durability may be improved.

Figure 12:
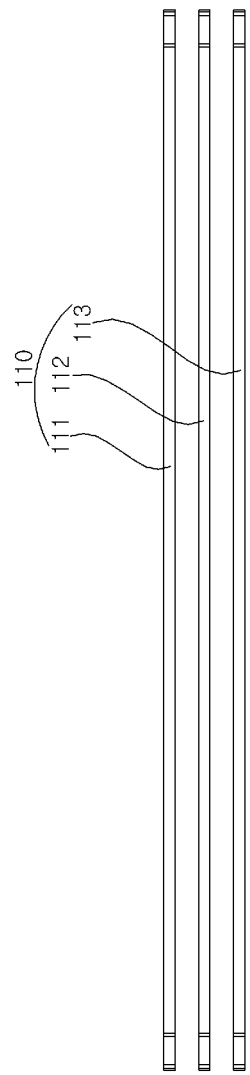
Figure 13:
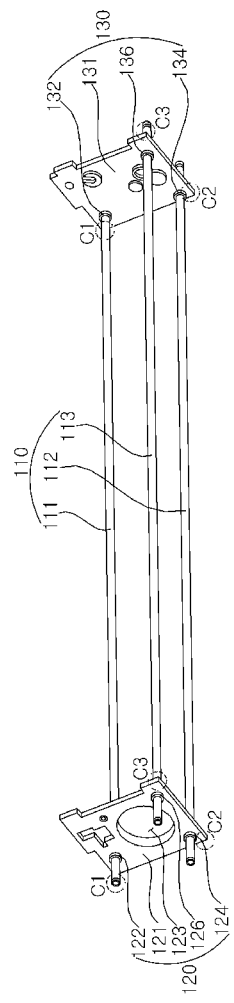

Referring to FIGS. 12 and 13, a pipe 110 may extend long in the leftward-rightward direction. A plurality of pipes 110 may be provided. The plurality of pipes 110 may include a first pipe 111, a second pipe 112, and a third pipe 113. The plurality of pipes 110 may be parallel to each other. For example, each pipe 110 may be a hollow cylinder. As another example, each pipe 110 may be a cylindrical bar.

The pipes 110 may be inserted through frames 120 and 130 so as to be coupled to the frames 120 and 130. The frames 120 and 130 may include a first frame 120 and a second frame 130. The first frame 120 may be located adjacent to one end of each pipe 110, and the second frame 130 may be located adjacent to the other end of each pipe 110. The first frame 120 may face the second frame 130.

For example, each of the frames 120 and 130 may be a quadrangular plate. The first pipe 111 may be inserted through the frames 120 and 130 in the state of being adjacent to a first corner C1 of each of the first frame 120 and the second frame 130. The second pipe 112 may be inserted through the frames 120 and 130 in the state of being adjacent to a second corner C2 of each of the first frame 120 and the second frame 130. The third pipe 113 may be inserted through the frames 120 and 130 in the state of being adjacent to a third corner C3 of each of the first frame 120 and the second frame 130.

A center opening 123 may be formed in a plate 121 of the first frame 120. The center opening 123 may be a circle formed through the plate 121 of the first frame 120. The first pipe 111, the second pipe 112, and the third pipe 113 may be disposed while forming a triangle with respect to the center opening 123.

Referring to FIG. 13, coupling ports 122, 124, 126, 132, 134, and 136 may be formed in plates 121 and 131. The first frame 120 may include an 11th coupling port 122, a 12th coupling port 124, and a 13th coupling port 126. The second frame 130 may include a 21st coupling port 132, a 22nd coupling port 134, and a 23rd coupling port 136. The first pipe 111 may be inserted through the 11th coupling port 122 and the 21st coupling port 132. The second pipe 112 may be inserted through the 12th coupling port 124 and the 22nd coupling port 134. The third pipe 113 may be inserted through the 13th coupling port 126 and the 23rd coupling port 136. The coupling ports 122, 124, 126, 132, 134, and 136 may be referred to as intermediate couplers 122, 124, 126, 132, 134, and 136.

Figure 14:
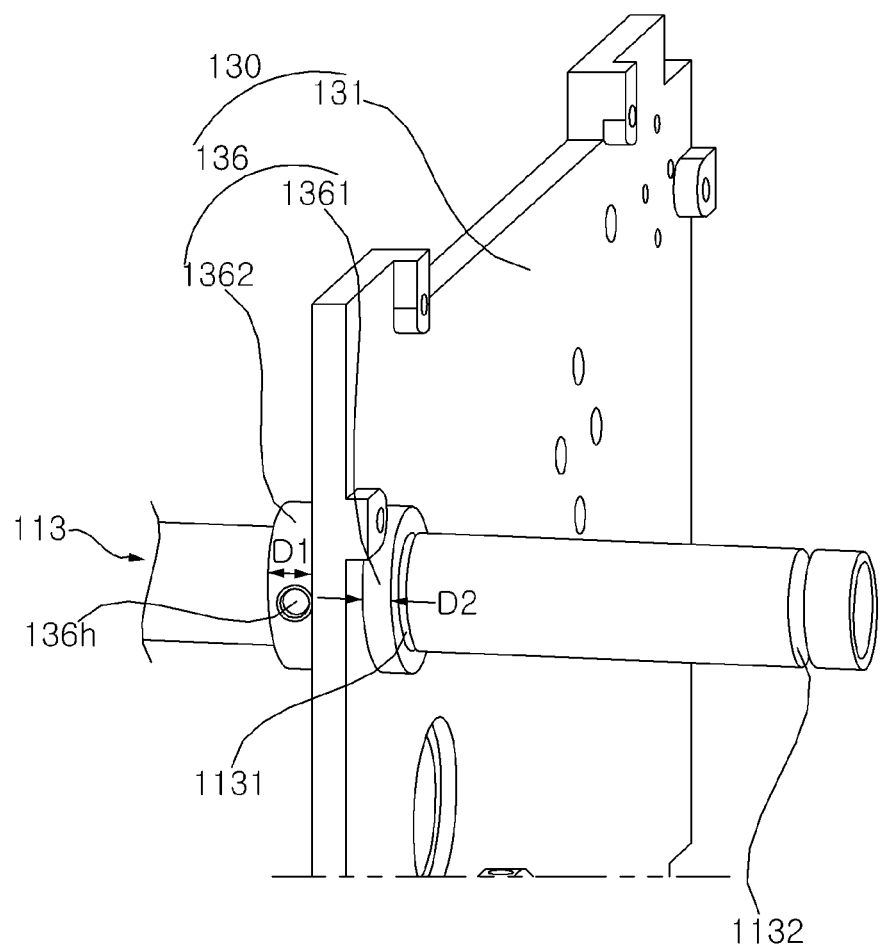
Figure 15:
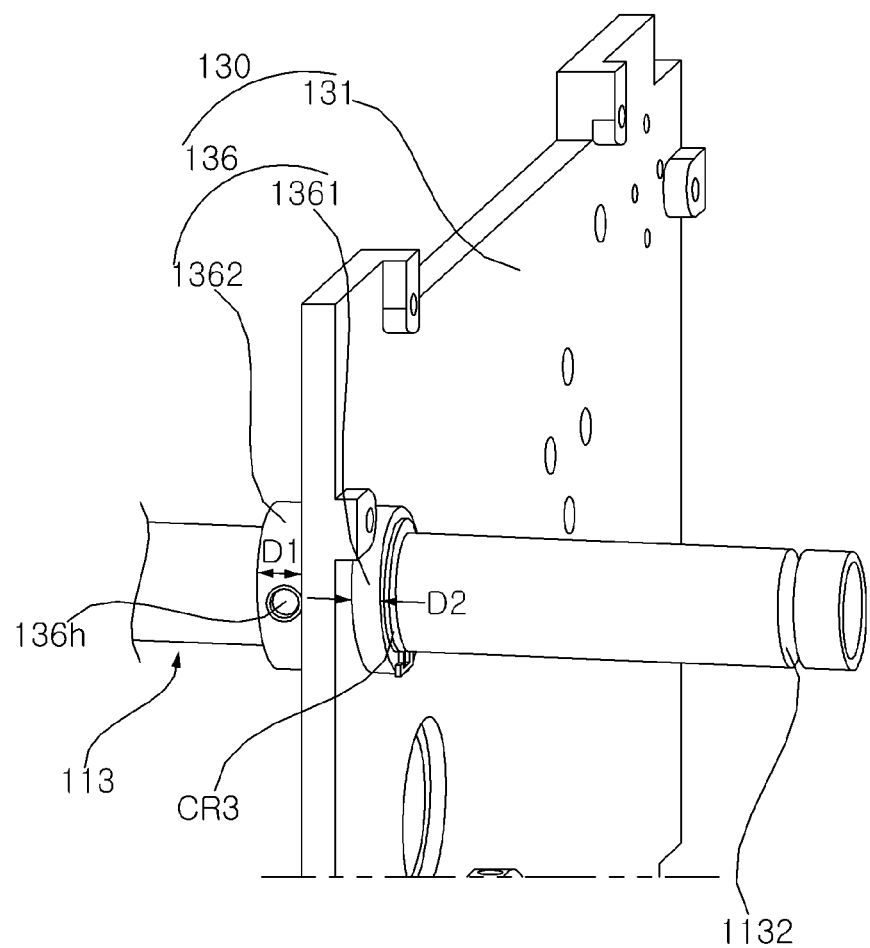
Figure 16:
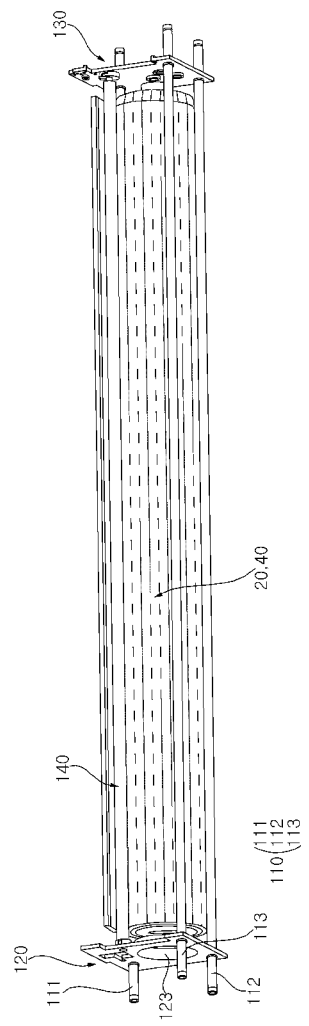
Figure 17:
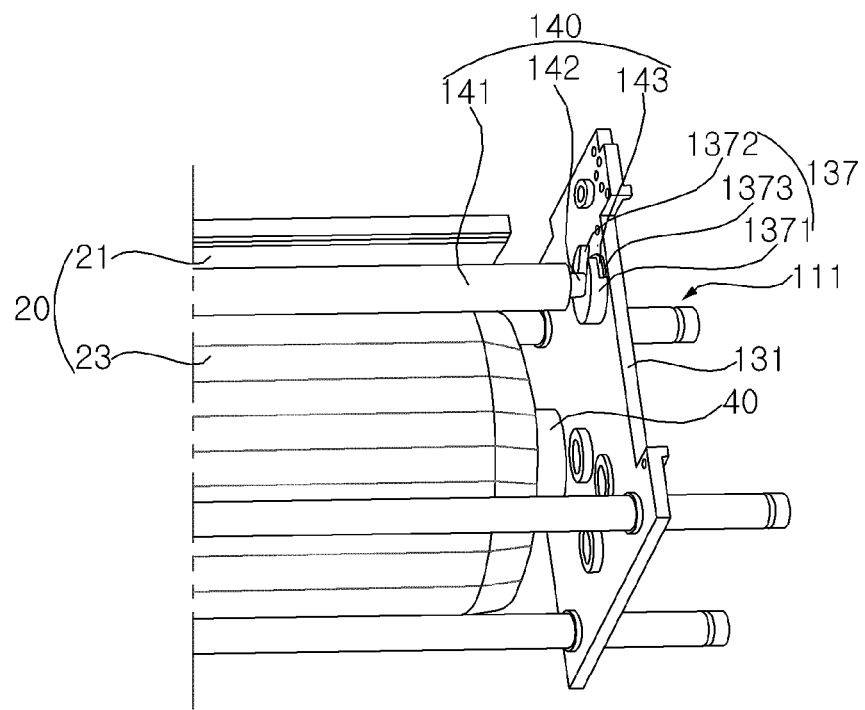
Figure 18:
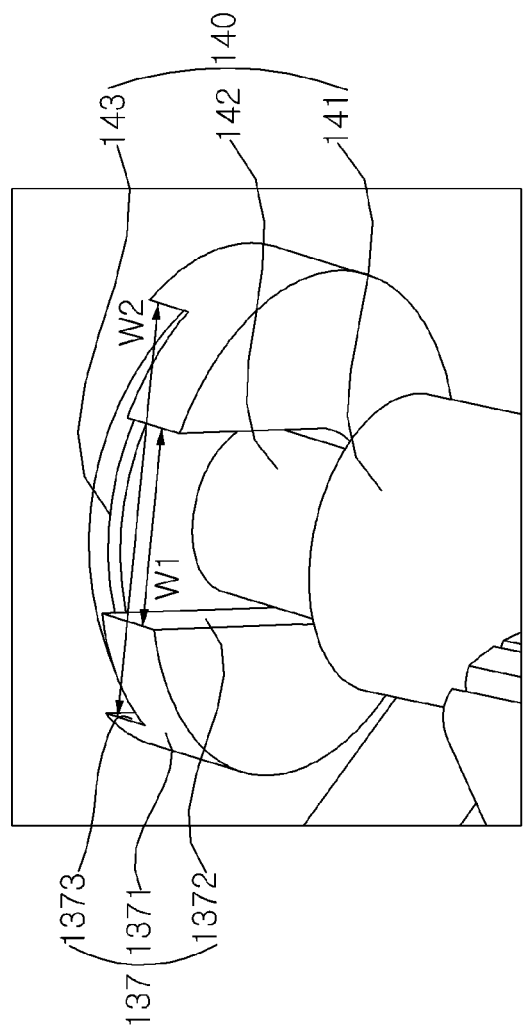
Figure 19:
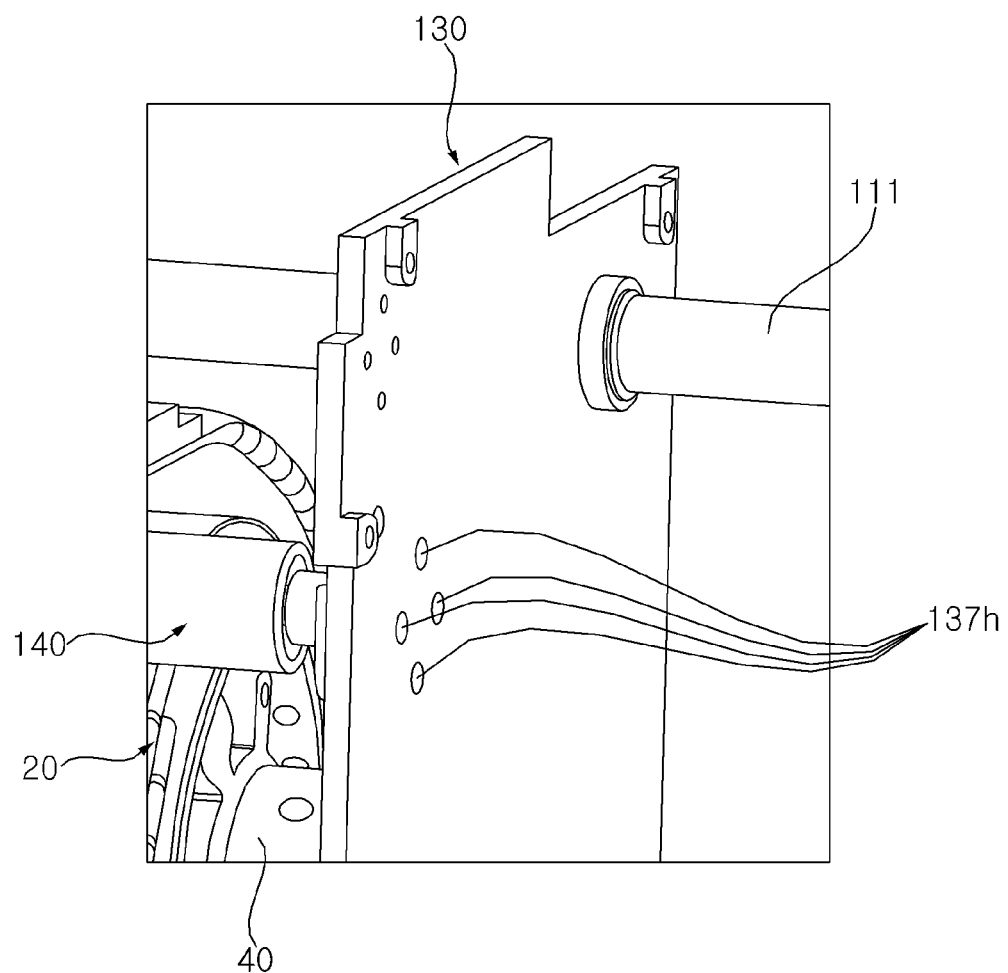

Referring to FIGS. 14 and 15, the coupling port 136 may have a cylindrical shape formed through the plate 131. The coupling port 136 may be fixed to the plate 131, or may be formed integrally with the plate 131. The coupling port 136 may have an outside 1361 and an inside 1362 with respect to the plate 131. The distance D2 of the outside 1361 may be less than the distance D1 of the inside 1362. A fastening hole 136h may be formed in the inside 1362. A screw may be fastened to the fastening hole 136h, whereby the pipe 113 may be fixed to the frame 130.

A first neck 1131 may be recessed inwardly of the pipe 113 in the state of being adjacent to the outside 1361 of the coupling port 136 to form an engraved ring in the outer surface of the pipe 113. A second neck 1132 may be recessed inwardly of the pipe 113 in the state of being spaced apart from the distal end of the pipe 113 while being adjacent to the distal end of the pipe 113 to form an engraved ring in the outer surface of the pipe 113. A coupling ring CR3 may be fastened to the first neck 1131, whereby the pipe 113 may be securely fixed to the frame 130. For example, the coupling ring CR3 may be an E ring.

Referring to FIGS. 16 to 19, the display unit 20 wound around the panel roller 40 may be inserted between the first pipe 111, the second pipe 112, the third pipe 113, the first frame 120, and/or the second frame 130. The panel roller 40 may be disposed parallel to the first pipe 111, the second pipe 112, or the third pipe 113.

A guide roller 140 may be coupled to the frames 120 and 130 in the state in which the panel roller 40 and the display unit 20 are located between the pipes 110 and the frames 120 and 130. The guide roller 140 may have a shaft 142, a roller 141, and a fixing plate 143.

A support 137 may be formed at the plate 131. The support 137 may support the shaft 142 of the guide roller 140. The shaft 142 is fixed to the support 137, and the guide roller 140 may be rotated on the shaft 142. The support 137 may be formed inside the plate 131.

The support 137 may include a body 1371, a shaft recess 1372, and a plate recess 1373. The body 1371 may have a cylindrical shape protruding from the inner surface of the plate 131. The shaft recess 1372 may be recessed inwardly of the body 1371 from the outer circumferential surface of the body 1371. The plate recess 1373 may be recessed inwardly of the body 1371 from the outer circumferential surface of the body 1371 between the shaft recess 1372 and the plate 131. The recess width W2 of the plate recess 1373 may be greater than the recess width W1 of the shaft recess 1372.

In other words, the shaft recess 1372 may have a recess width W1 corresponding to the diameter of the shaft 142, and the plate recess 1373 may have a recess width W2 corresponding to the diameter of the fixing plate 143. The shaft 142 of the guide roller 140 is inserted into the shaft recess 1372 of the support 137, and the fixing plate 143 of the guide roller 140 is inserted into the plate recess 1373 of the support 137, whereby the guide roller 140 may be supported by the support 137.

Figure 21:
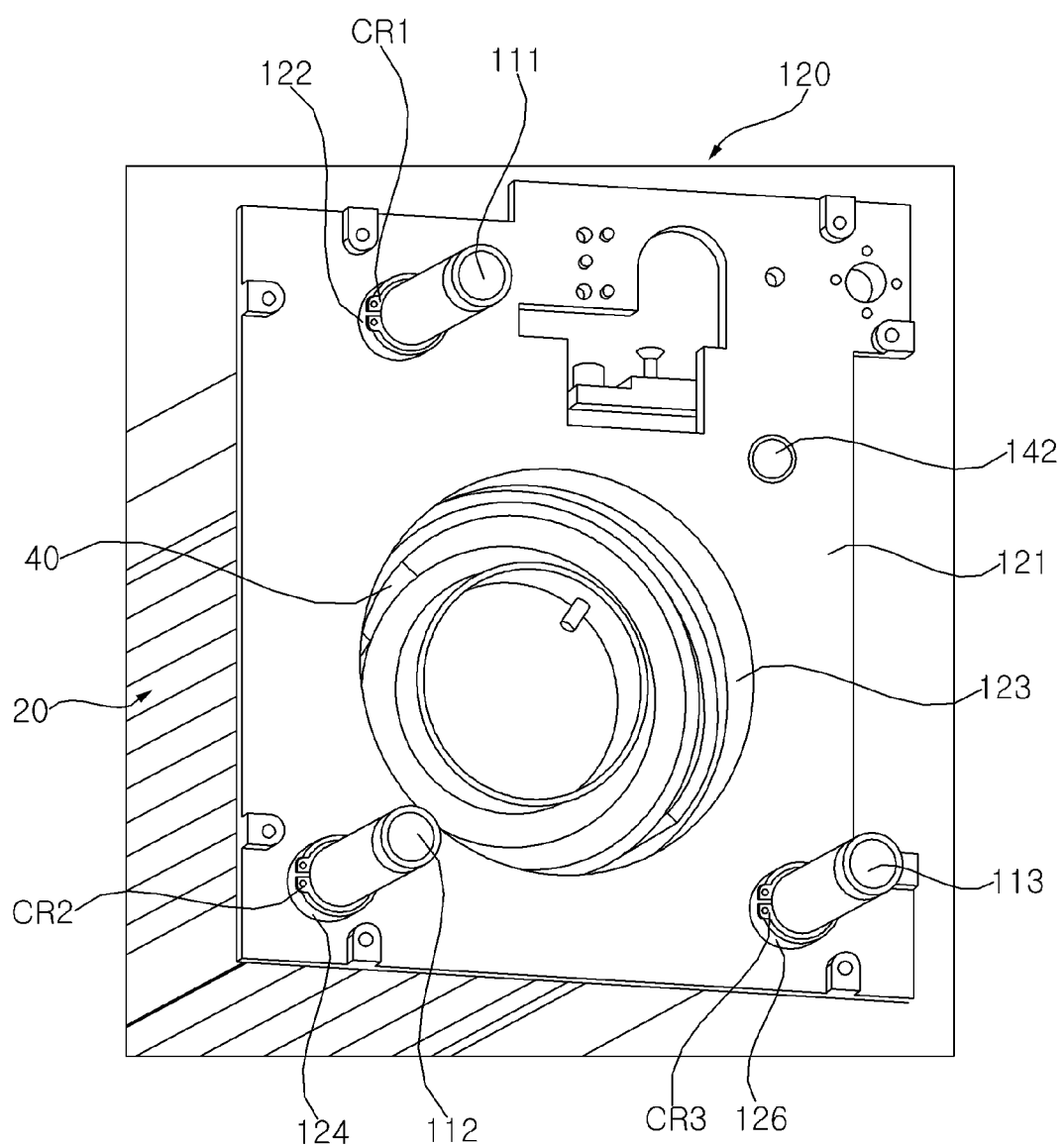
Figure 22:
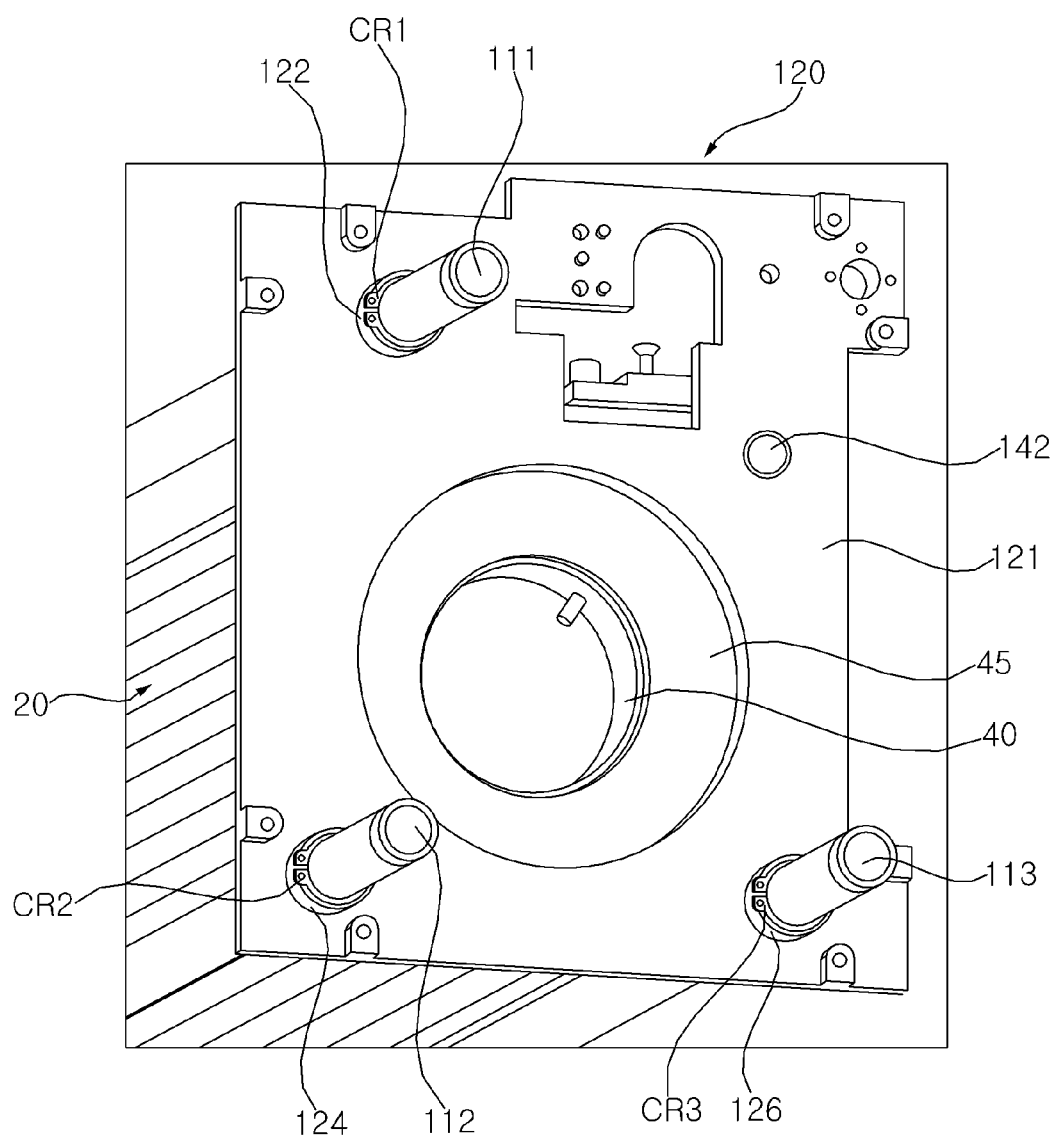

The fixing plate 143 may be fixed to the frame 130 via fastening members (e.g. screws) fastened to fastening holes 137h formed through the frame 130. Referring to FIG. 21, the shaft 142 may be inserted into and fixed to the frame 120.

Figure 20:
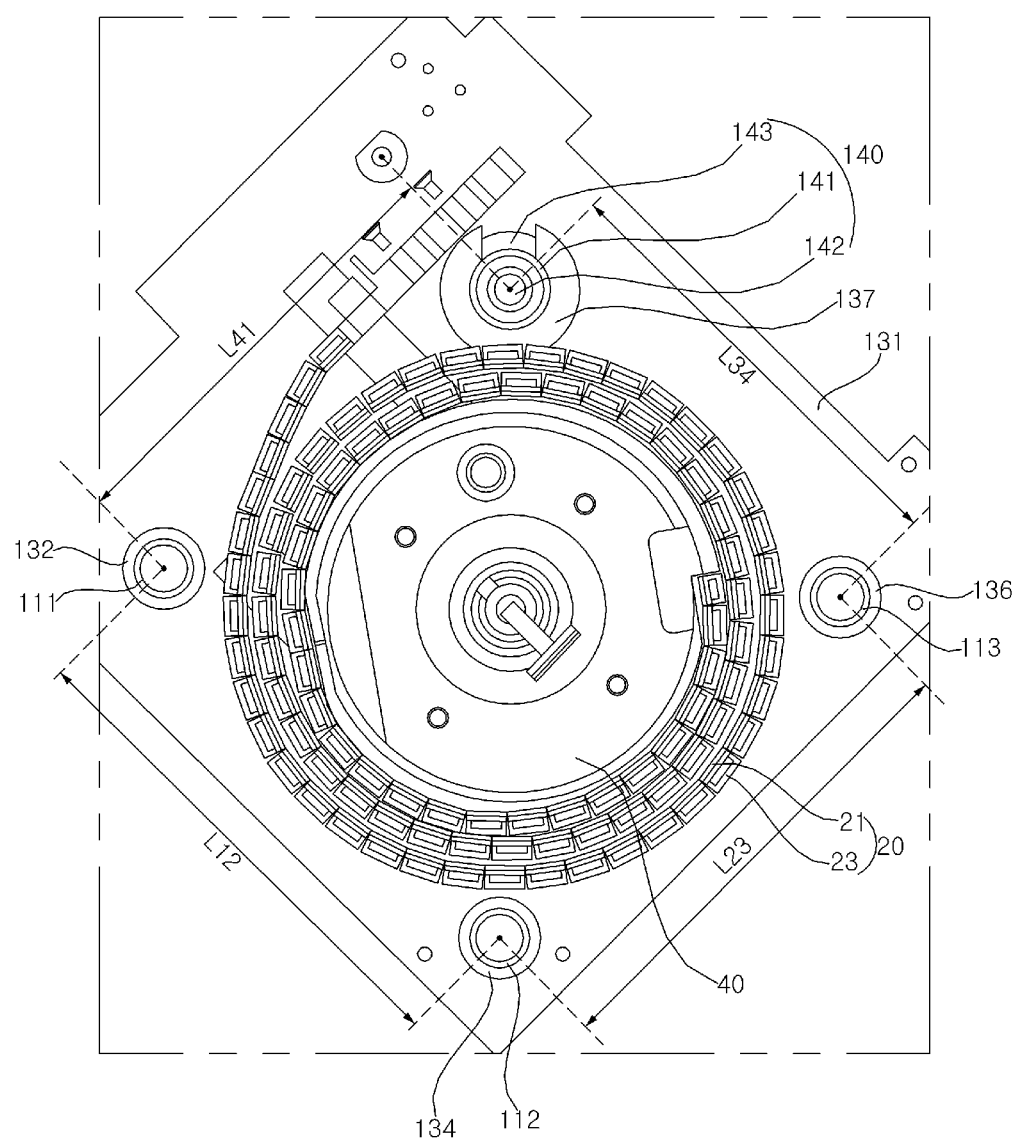

Referring to FIG. 20, the distance L12 between the first pipe 111 and the second pipe 112 may be greater than the distance L23 between the second pipe 112 and the third pipe 113. The distance L12 between the first pipe 111 and the second pipe 112 may be greater than the distance L34 between the third pipe 113 and the guide roller 140. The distance L12 between the first pipe 111 and the second pipe 112 may be greater than the distance L41 between the first pipe 111 and the guide roller 140. The distance L23 between the second pipe 112 and the third pipe 113 may be greater than the distance L41 between the first pipe 111 and the guide roller 140. The distance L23 between the second pipe 112 and the third pipe 113 may be greater than the distance L34 between the third pipe 113 and the guide roller 140. The distance L34 between the third pipe 113 and the guide roller 140 may be greater than the distance L41 between the guide roller 140 and the first pipe 111. Consequently, it is possible to improve twisting rigidity as well as drooping rigidity of the display device.

Referring to FIGS. 21 to 24, one end of the panel roller 40 may be located adjacent to the center opening 123 of the first frame 120. A rotary shaft of the panel roller 40 may be aligned with the center of the center opening 123 of the first frame 120. A bearing 45 may be mounted in the center opening 123 of the first frame 120. For example, the bearing 45 may be a ring bearing 45. One end of the panel roller 40 may be inserted into or forcibly fitted into the bearing 45. The other end of the panel roller 40 may be rotatably coupled to the second frame 130. The panel roller 40 may have a rotary shaft 46, and the rotary shaft 46 may be installed at the second frame 130 through the first frame 130. The rotary shaft 46 may be connected to the lever 47, and the panel roller 40 may be manually rotated through the lever 47.

The coupling port 136 may have a cylindrical shape formed through the plate 131. The coupling port 136 may be fixed to the plate 131, or may be formed integrally with the plate 131. The coupling port 136 may have an outside 1361 and an inside 1362 with respect to the plate 131. The distance D2 of the outside 1361 may be less than the distance D1 of the inside 1362. For example, the distance D1 of the inside 1362 may be five or more times of the distance D2 of the outside 1361.

The pipes 112 and 113 may be forcibly fitted into outsides 1341 and 1361 through insides 1342 and 1362 of the coupling ports 134 and 136. The pipes 112 and 113 may not extend through the coupling ports 134 and 136. The outsides 1341 and 1361 of the coupling ports 134 and 136 may cover the distal ends of the pipes 112 and 113. A first fastening hole 136h1 and a second fastening hole 136h2 may be formed in the inside 1362. Screws may be fastened to the first fastening hole 136h1 and the second fastening hole 136h2, whereby the pipe 113 may be securely fixed to the frame 130.

Figure 25:
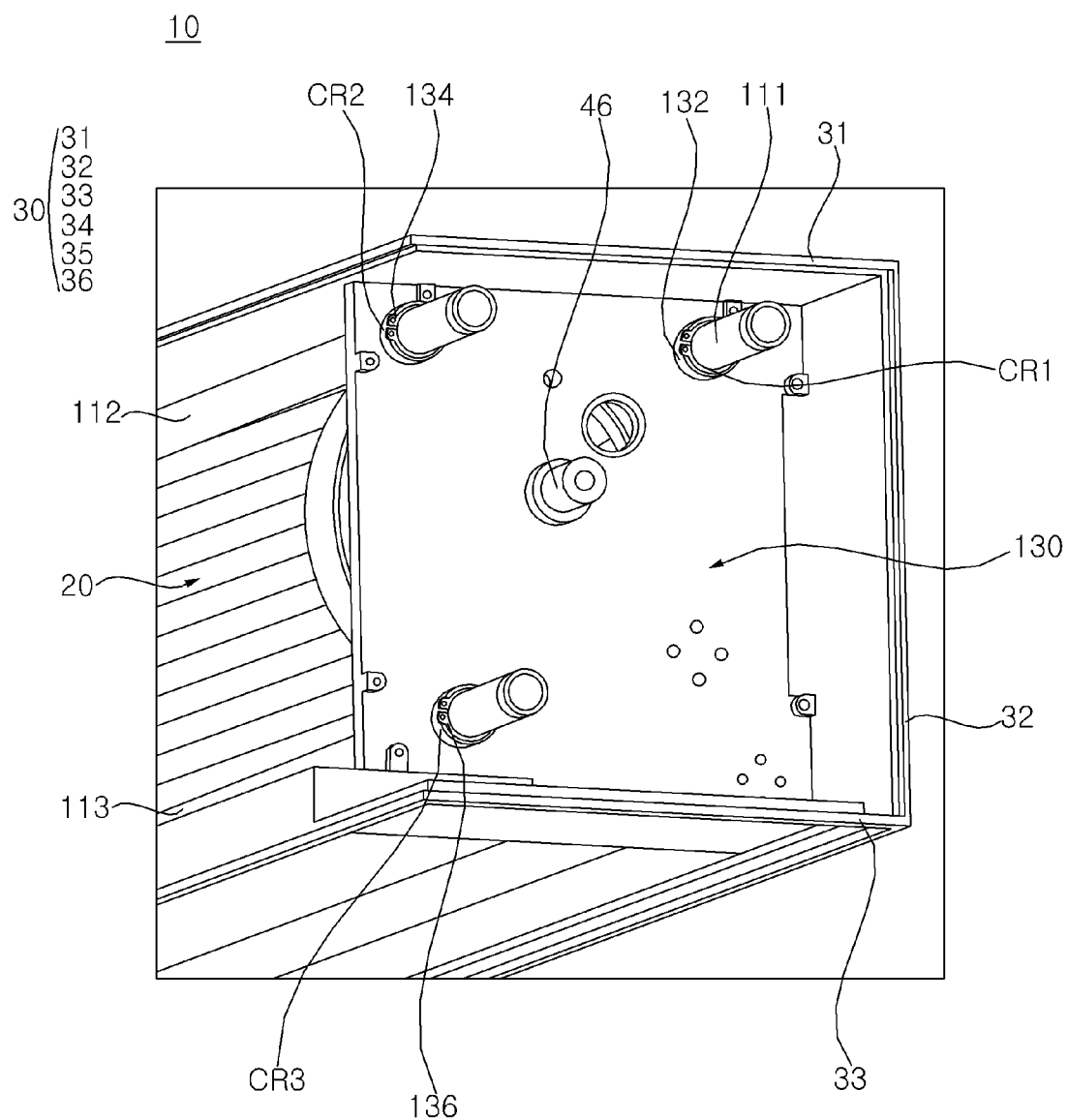

Referring to FIG. 25, the housing 30 may include an upper plate 31, a lower plate 33, a front plate 34 (see FIG. 1), and a rear plate 32. The upper plate 31 may be coupled to the first frame 120 and the second frame 130 while covering the first pipe 111 and the second pipe 112. The front plate 34 may be coupled to the first frame 120 and the second frame 130 while covering the second pipe 112 and the third pipe 113. The rear plate 32 may be coupled to the first frame 120 and the second frame 130 while covering the first pipe 111 and the guide roller 140. The lower plate 33 may be coupled to the first frame 120 and the second frame 130 while covering the third pipe 113 and the guide roller 140. The lower plate 33 may be a door.

Figure 26:
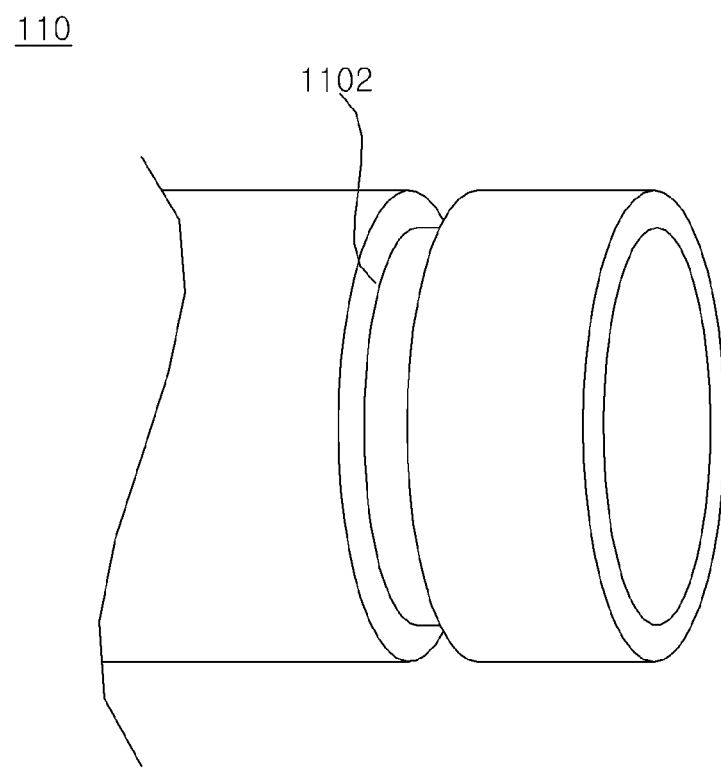
Figure 27:
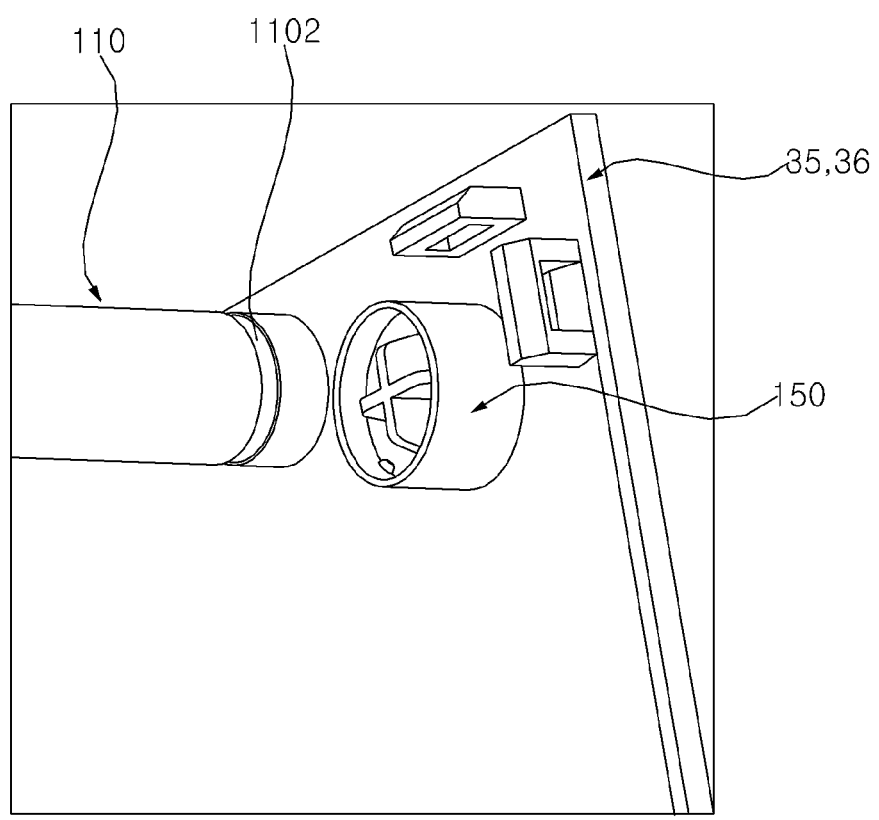

Referring to FIGS. 26 and 27, the pipe 110 may have a neck 1102 located adjacent to the distal end thereof, the neck 1102 being formed at the outer circumferential surface of the pipe 110. The neck 1102 may be the second neck 1132 described with reference to FIGS. 14 and 15. The description of the pipe 110 may be applied to the first pipe 111, the second pipe 112, and the third pipe 113.

The pipe 110 may be coupled to side covers 35 and 36. A coupling port 150 may be formed inside each of the side covers 35 and 36. The pipe 110 may be inserted or forcibly fitted into the coupling ports 150, whereby the pipe 110 may be fixed to the side covers 35 and 36. The coupling port 150 may be referred to as an end coupler 150.

Figure 28:
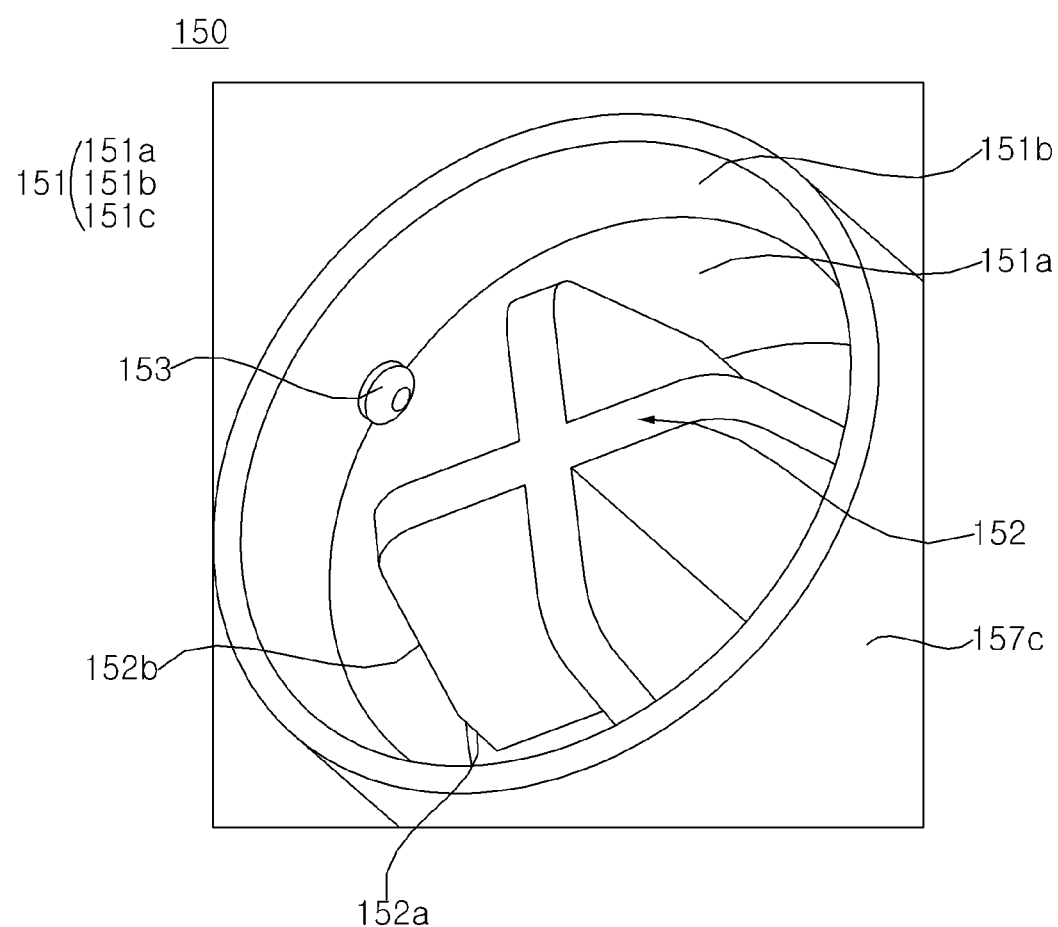
Figure 29:
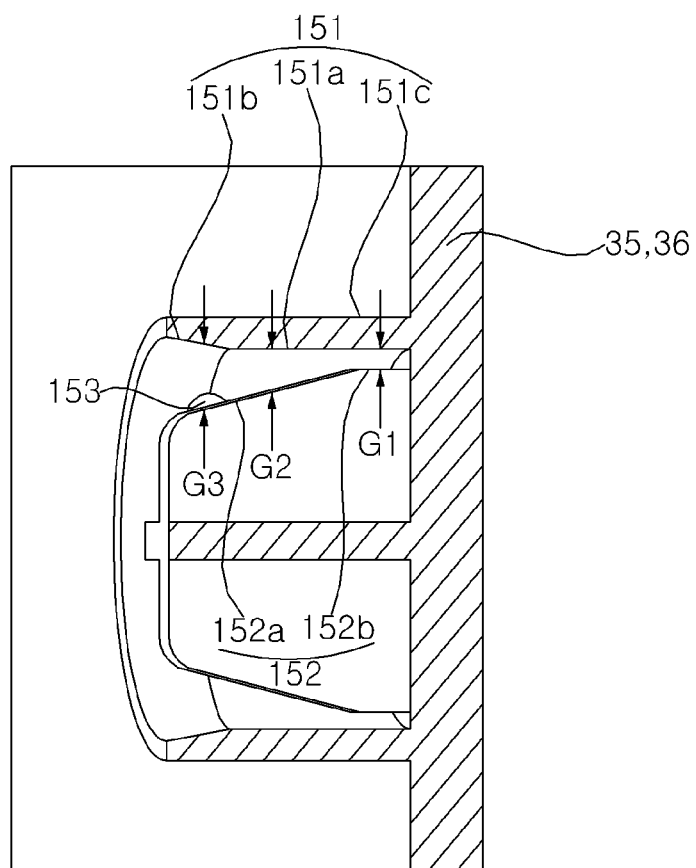

Referring to FIGS. 28 and 29, the coupling port 150 may have an outer cylinder 151 and an inner insert 152. The outer cylinder 151 may have a hollow cylindrical shape. The outer cylinder 151 may have an outer surface 151c, a first inner surface 151a, and a second inner surface 151b. The first inner surface 151a may be parallel to the outer surface 151c. The second inner surface 151b may extend from the first inner surface 151a to the distal end of the outer cylinder 151 in the state of being inclined. The diameter of the second inner surface 151b may gradually increase from the diameter of the first inner surface 151a to the diameter of the outer surface 151c. The second inner surface 151b may be referred to as a guide surface 151*b*, and the first inner surface 151*a* may be referred to as a forcible fitting surface 151*a*. A protrusion 153 may be formed inside the outer cylinder 151. For example, the protrusion 153 may be located at the border of the first inner surface 151*a* and the second inner surface 151*b*.

The inner insert 152 may be a rib extending from the side covers 35 and 36 (see FIG. 27) toward the distal end of the second inner surface 151*b* of the outer cylinder 151. The inner insert 152 may have a shape in which at least two ribs intersect. The inner insert 152 may have a first outer surface 152*a* and a second outer surface 152*b*. The first outer surface 152*a* may be spaced apart from the first inner surface 151*a* of the outer cylinder 151, and may be parallel to the first inner surface 151*a* of the outer cylinder 151. For example, the distance G1 between the first inner surface 151*a* of the outer cylinder 151 and the first outer surface 152*a* of the inner insert 152 may be substantially equal to or less than the thickness of the pipe 110. The second outer surface 152*b* of the inner insert 152 may extend from the first outer surface 152*a* to the distal end of the inner insert 152 in the state of being inclined. The second outer surface 152*b* of the inner insert 152 may be gradually distant from the first inner surface 151*a* and/or the second inner surface 151*b* of the outer cylinder 151. For example, the inner insert 152 may have a wedge shape. The second outer surface 152*b* of the inner insert 152 may face the first inner surface 151*a* and the second inner surface 151*b* of the outer cylinder 151.

The distance G1 between the first inner surface 151*a* of the outer cylinder 151 and the first outer surface 152*a* of the inner insert 152 may be less than the distance G2 between the first inner surface 151*a* of the outer cylinder 151 and the second outer surface 152*b* of the inner insert 152. The distance G2 between the first inner surface 151*a* of the outer cylinder 151 and the second outer surface 152*b* of the inner insert 152 may be less than the distance G3 between the second inner surface 151*b* of the outer cylinder 151 and the second outer surface 152*b* of the inner insert 152.

Figure 30:
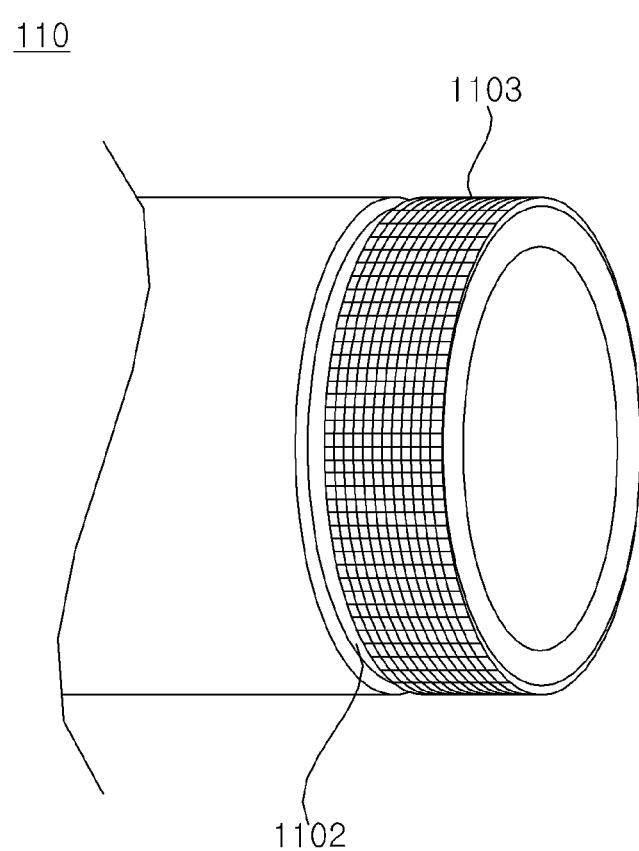

Referring to FIG. 30, the pipe 110 may have a forcible fitting surface 1103. The forcible fitting surface 1103 may be formed at the outer surface of the pipe 110 between the neck 1102 of the pipe 110 and the distal end of the pipe 110. The forcible fitting surface 1103 may be a coarse surface. For example, the forcible fitting surface 1103 may be a knurling portion.

Figure 31:
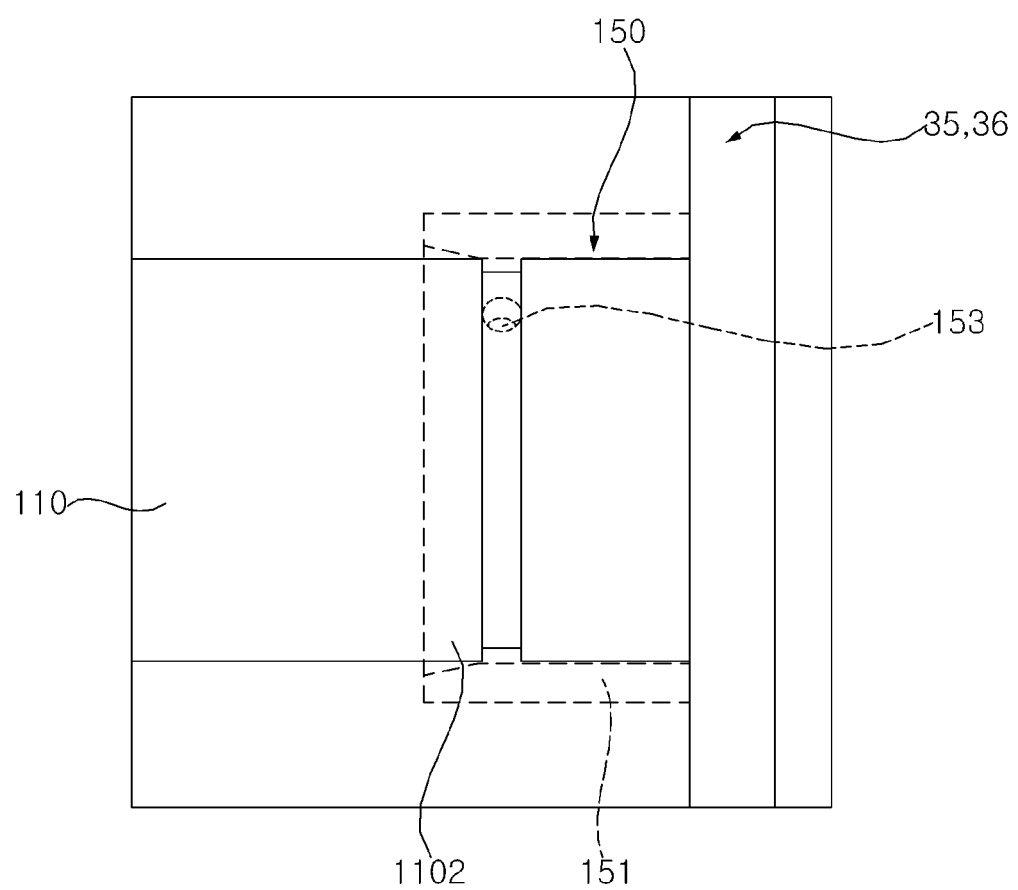
Figure 32:
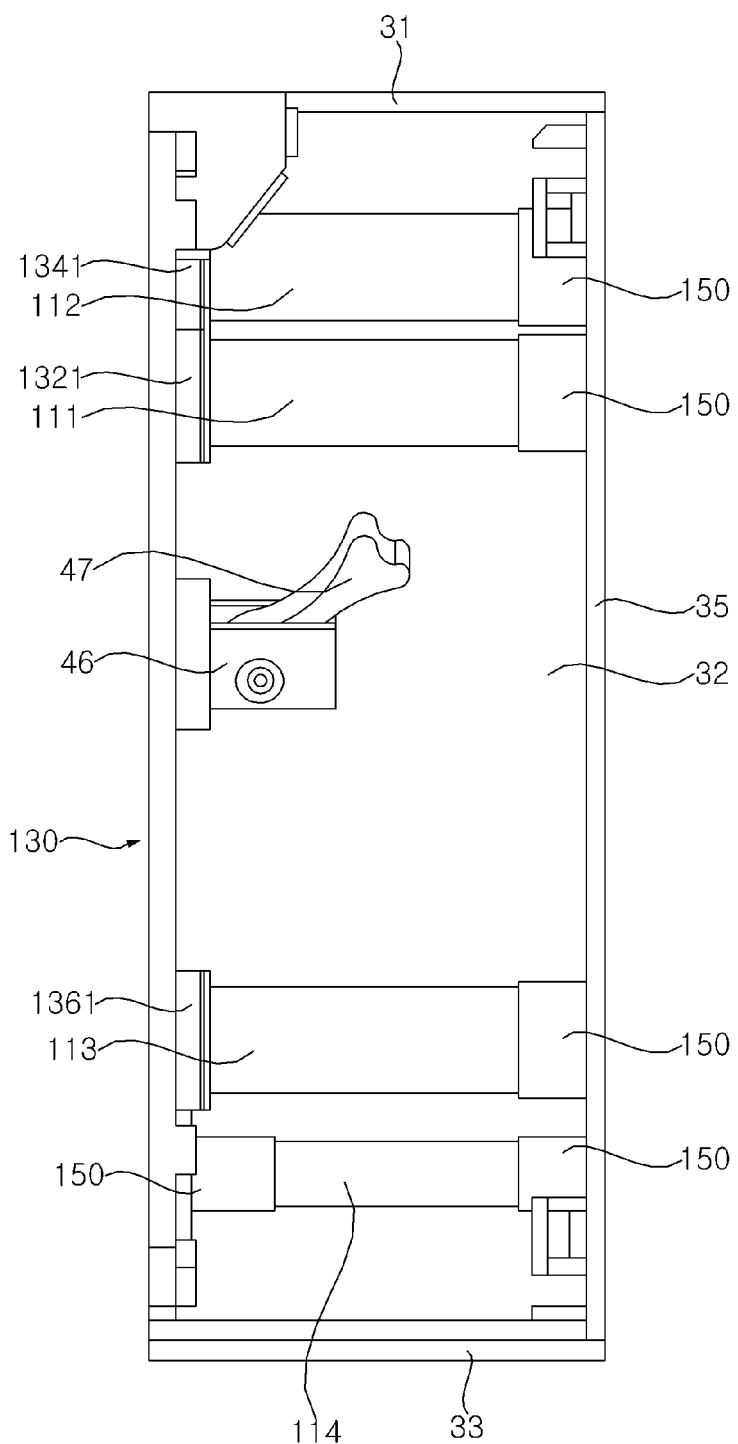
Figure 33:
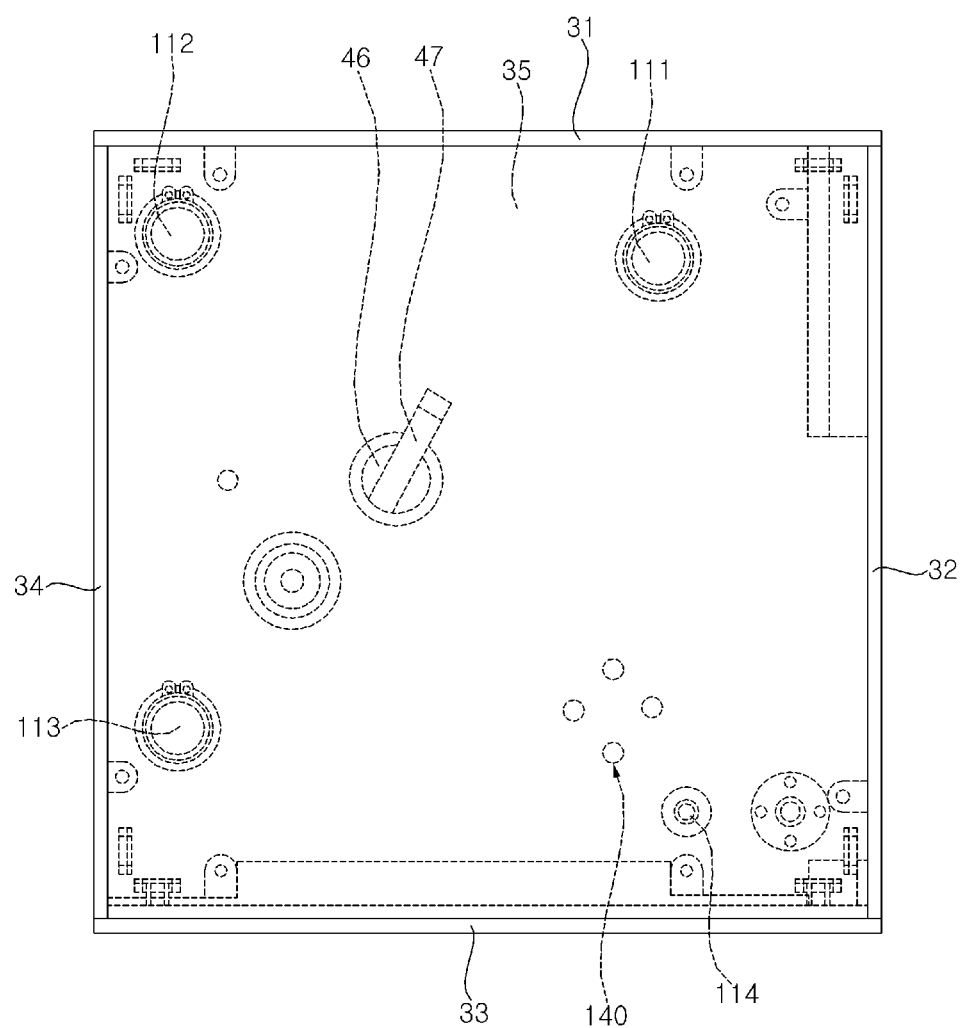

Referring to FIGS. 31 to 33, the pipe 110 may be inserted or forcibly fitted into the coupling port 150. The protrusion 153 may be inserted into the second neck 1102 of the pipe 110. The first pipe 111, the second pipe 112, and the third pipe 113 may be inserted or forcibly fitted into corresponding coupling ports 150. Consequently, it is possible to secure twisting rigidity of the display device.

Figure 23:
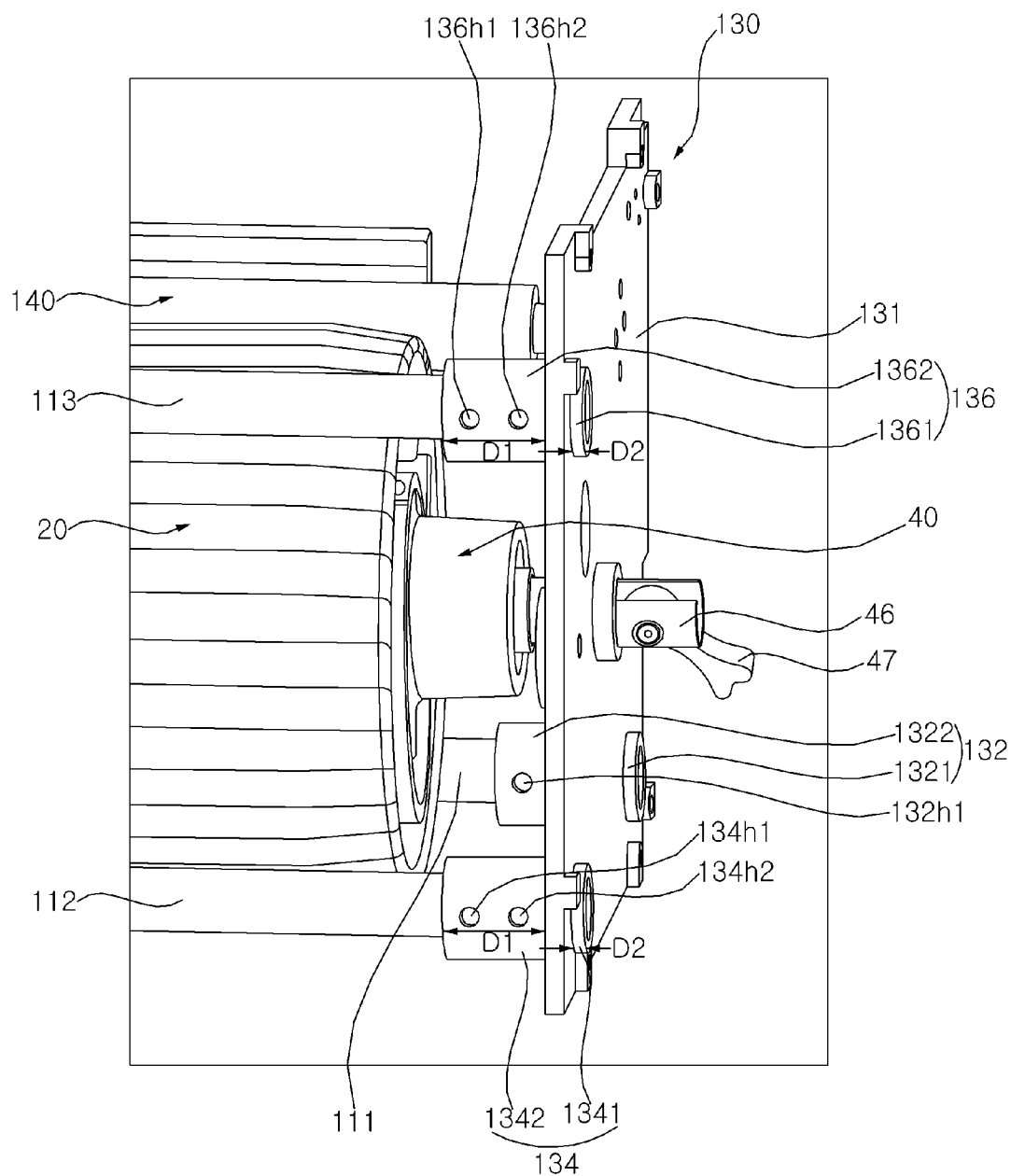
Figure 24:
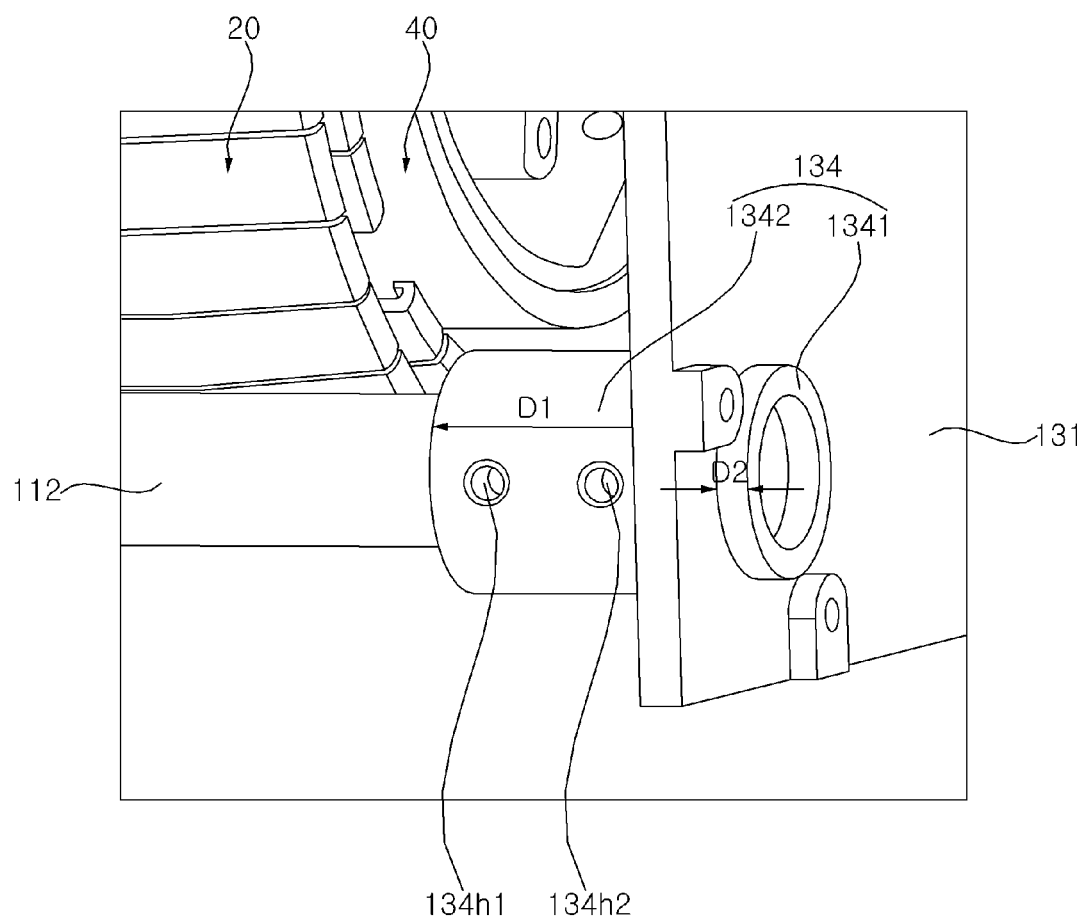

An auxiliary pipe 114 may be opposite the second pipe 112 with respect to the shaft 46 of the panel roller 40 (see FIG. 23). The auxiliary pipe 114 may be inserted or forcibly fitted into the coupling ports 150 formed in the second frame 130 and the side cover 35. Consequently, it is possible to further secure twisting rigidity of the display device and to secure coupling stability of the side cover.

Figure 34:
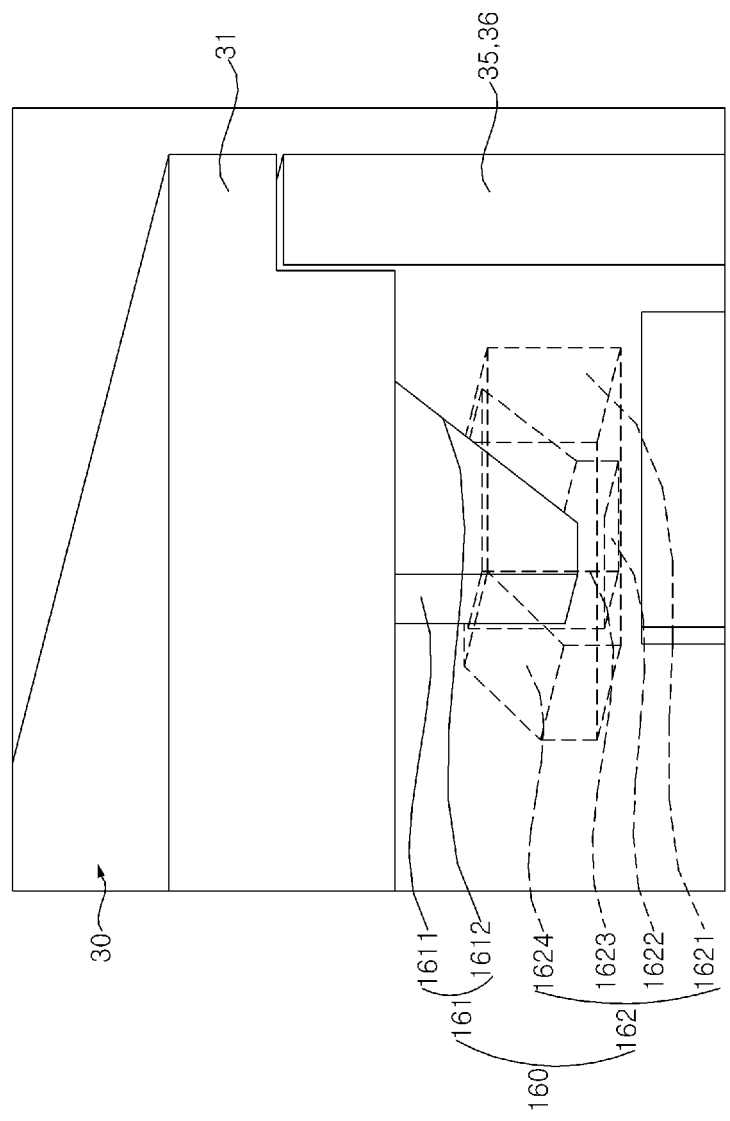

Referring to FIG. 34, a side coupler 160 may couple the housing 30 to the side covers 35 and 36. The side coupler 160 may include a catching portion 161 and a holder 162. The catching portion 161 may protrude from the inside of the upper plate 31 of the housing 30. The catching portion 161 may have a catching surface 1611 and an inclined surface 1612. The catching surface 1611 may extend downwards from the inner surface of the upper plate 31 of the housing 30. The inclined surface 1612 may connect the lower end of the catching surface 1611 and the inner surface of the upper plate 31 to each other. The inclined surface 1612 may face the side covers 35 and 36.

The holder 162 may be formed inside the side covers 35 and 36. The holder 162 may include a fixing portion 1621, a catching recess 1622, and a stopper 1623 and 1624. The fixing portion 1621 may be fixed inside the side covers 35 and 36. The stopper 1623 and 1624 may be located so as to be spaced apart from the fixing portion 1621. The catching recess 1622 may connect the fixing portion 1621 and the stopper 1623 and 1624 to each other. The catching recess 1622 may provide a space into which the catching portion 161 is inserted. The stopper 1623 and 1624 may have a vertical surface 1623 that faces or contacts the catching surface 1611 of the catching portion 161 and a guide surface 1624 on which the inclined surface 1612 of the catching portion 161 slides. The bottom surface of the catching recess 1622 may be spaced apart from the catching portion 161.

The side coupler 160 may be provided the lower plate 33, the front plate 34, and the rear plate 32 as well as the upper plate 31 of the housing 30. Consequently, the upper plate 31, the lower plat 33, the front plate 34, and/or the rear plate 32 may be securely coupled to the side covers 35 and 36.

Figure 35:
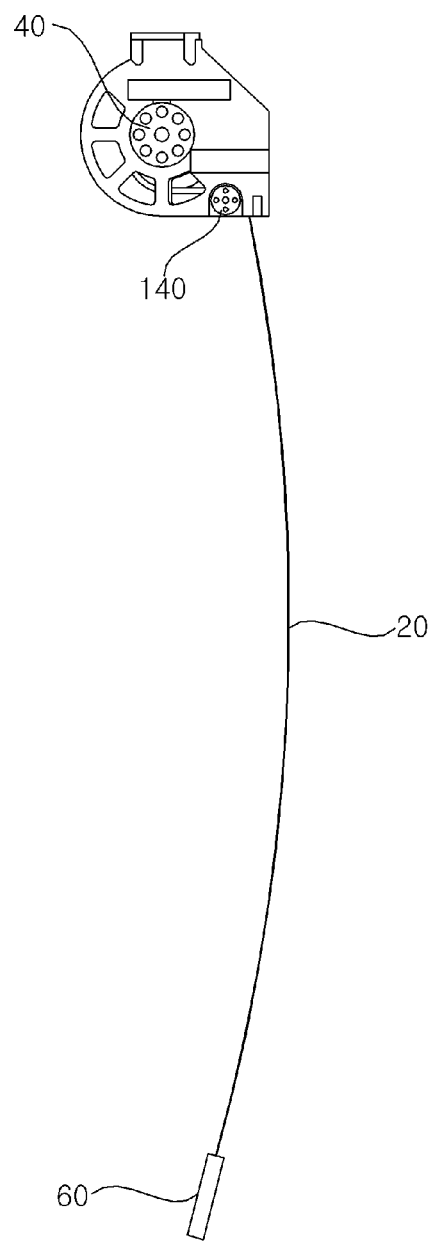

Referring to FIG. 35, the display unit 20 may move downwards while being unwound from the panel roller 40. The display unit 20 may move downwards while the guide roller 140 contacts the display unit 20 or while the guide roller 140 rolls on the display unit 20. The display unit 20 that has moved downwards from the panel roller 40 may be curved while forming a gentle curve due to the nature of the display unit wound around the panel roller 40. If an image is output in the state in which the display panel 21 (see FIG. 3) is curved, the image may be distorted.

Figure 36:
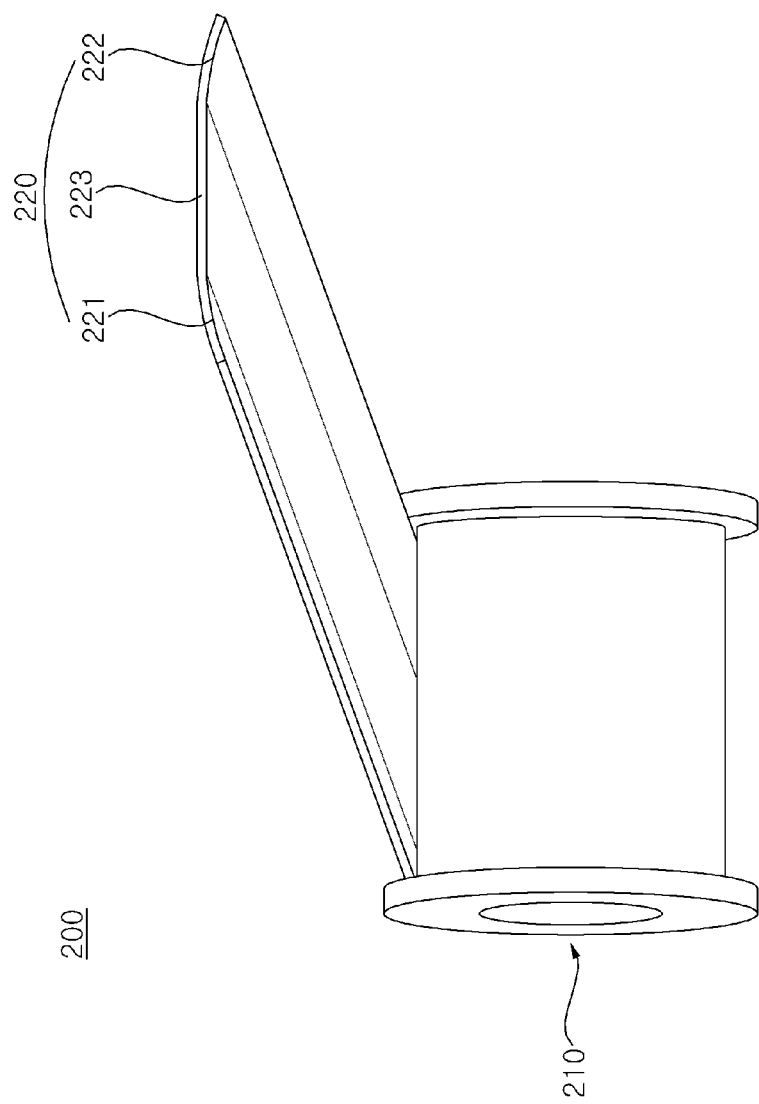
Figure 37:
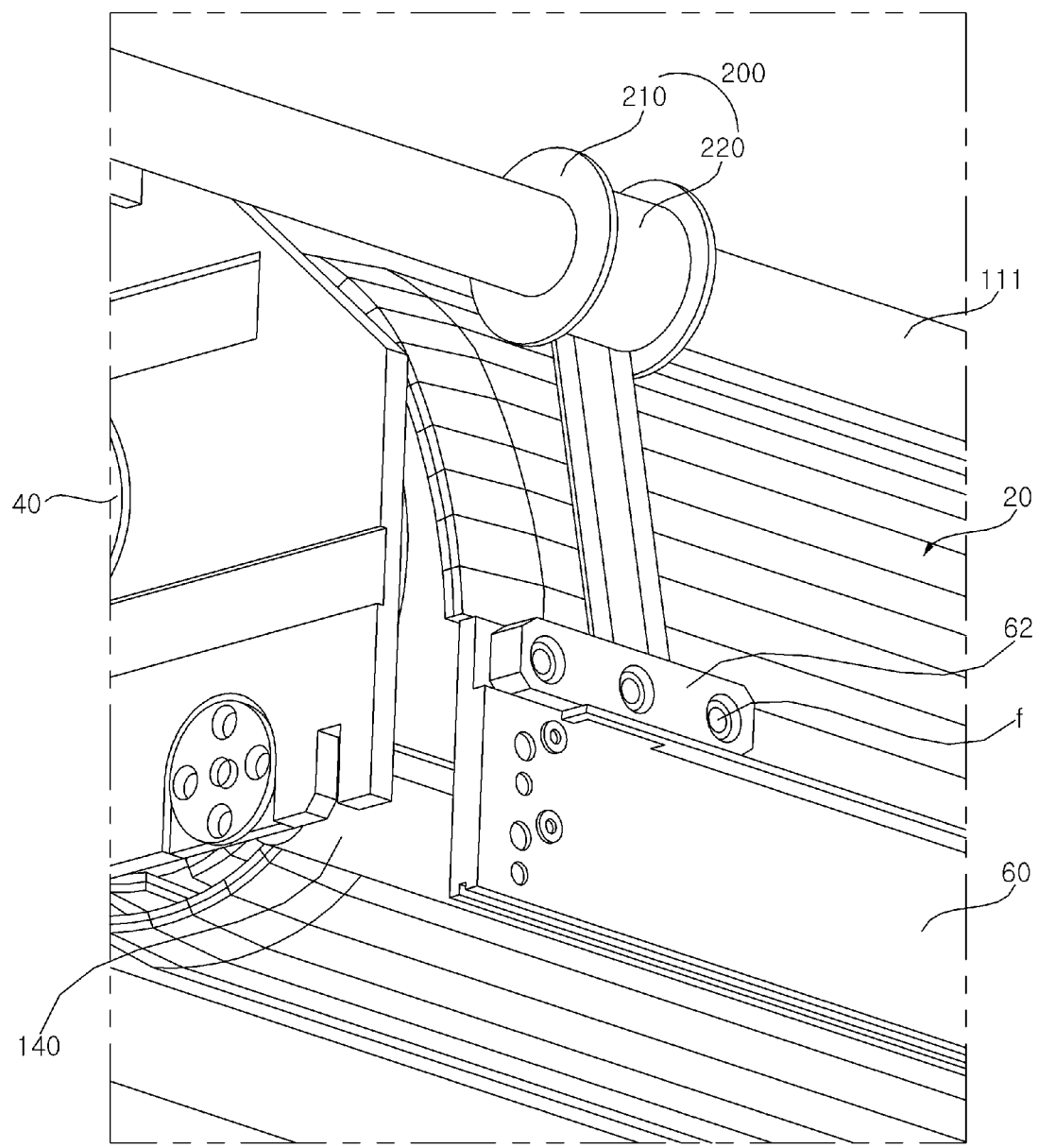

Referring to FIGS. 36 and 37, a correction unit 200 may include a correction roller 210 and a roll plate 220. The correction roller 210 may be installed at the first pipe 111. The first pipe 111 may be inserted into the correction roller 210. The correction roller 210 may be rotated relative to the first pipe 111. The roll plate 220 may be wound around or unwound from the correction roller 210. The roll plate 220 may have a flat surface 223 and curved surfaces 221 and 222. The flat surface 223 may extend long in the longitudinal direction of the roll plate 220. A plurality of curved surfaces 221 and 222 may be provided. The first curved surface 221 may extend long in the longitudinal direction of the roll plate 220, may be located parallel to the flat surface 223, and may be connected to the flat surface 223 in the state of neighboring the flat surface 223. The second curved surface 222 may extend long in the longitudinal direction of the roll plate 220, and may be opposite the first curved surface 221 with respect to the flat surface 223.

One end of the roll plate 220 in the longitudinal direction may be fixed to the correction roller 210, the roll plate 220 may be wound around the correction roller 210, and the other end of the roll plate 220 in the longitudinal direction may be fixed to the top case 60. The other end of the roll plate 220 may be inserted between the top case 60 and a fixing bar 62, and may be fixed to the top case 60. The fixing bar 62 may be fixed to the top case 60 via a fastening member f.

Figure 38:
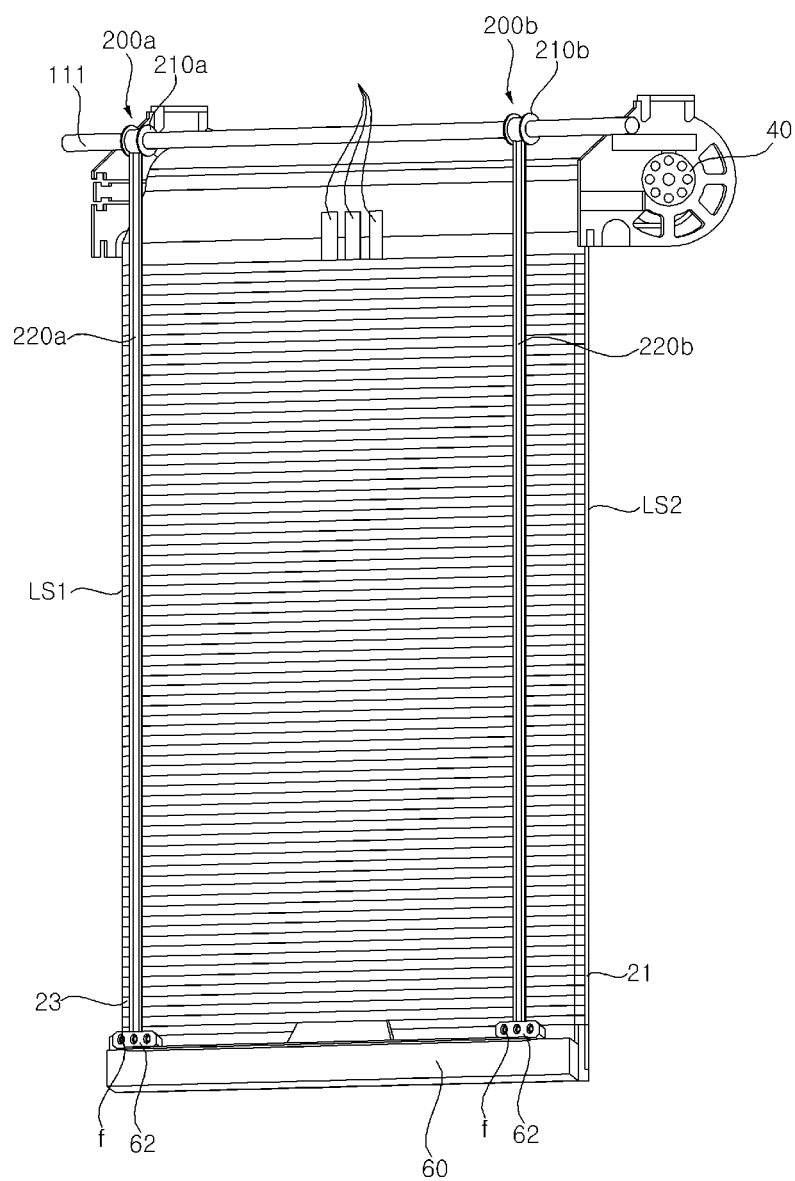
Figure 39:
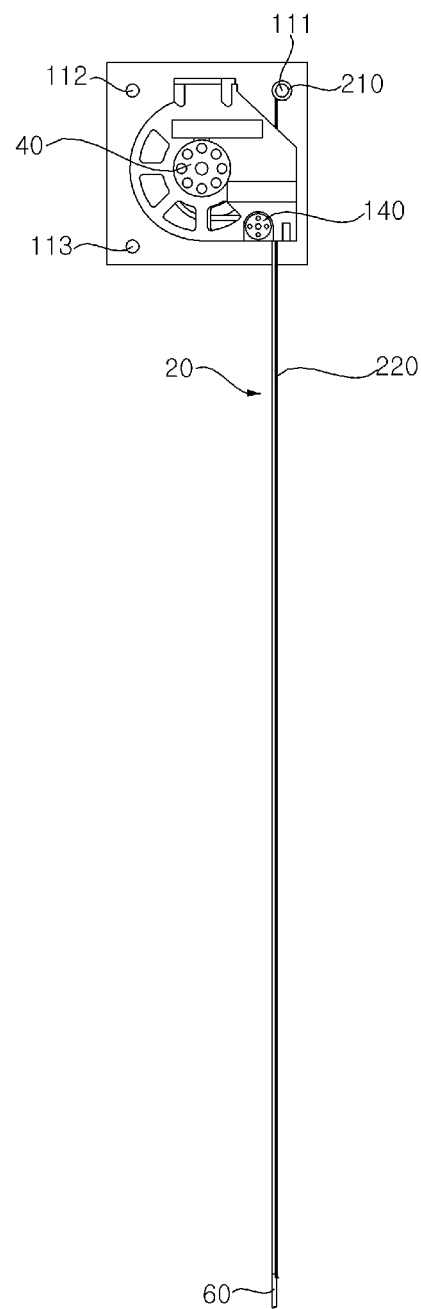

Referring to FIGS. 38 and 39, a first correction unit 200*a* may be installed on the first pipe 111 in the state of being adjacent to a first long side LS1 of the module cover 23. A second correction unit 200*b* may be installed on the first pipe 111 in the state of being adjacent to a second long side LS2 of the module cover 23. The distance between the first correction unit 200a and the second correction unit 200b may be less than the length of the module cover 23 in the leftward-rightward direction. As the module cover 23 is unwound from the panel roller 40, a first roll plate 220a of the first correction unit 200a and a second roll plate 220b of the second correction unit 200b may extend in the upward-downward direction of the module cover 23. The first roll plate 220a and/or the second roll plate 220b may contact the rear surface of the module cover 23. As the display unit 20 moves downwards together with the roll plate 220 of the correction unit 200, the display panel 21 (see FIG. 3) remains flat. Consequently, it is possible to prevent distortion of an image provided by the display panel 21.

Figure 40:
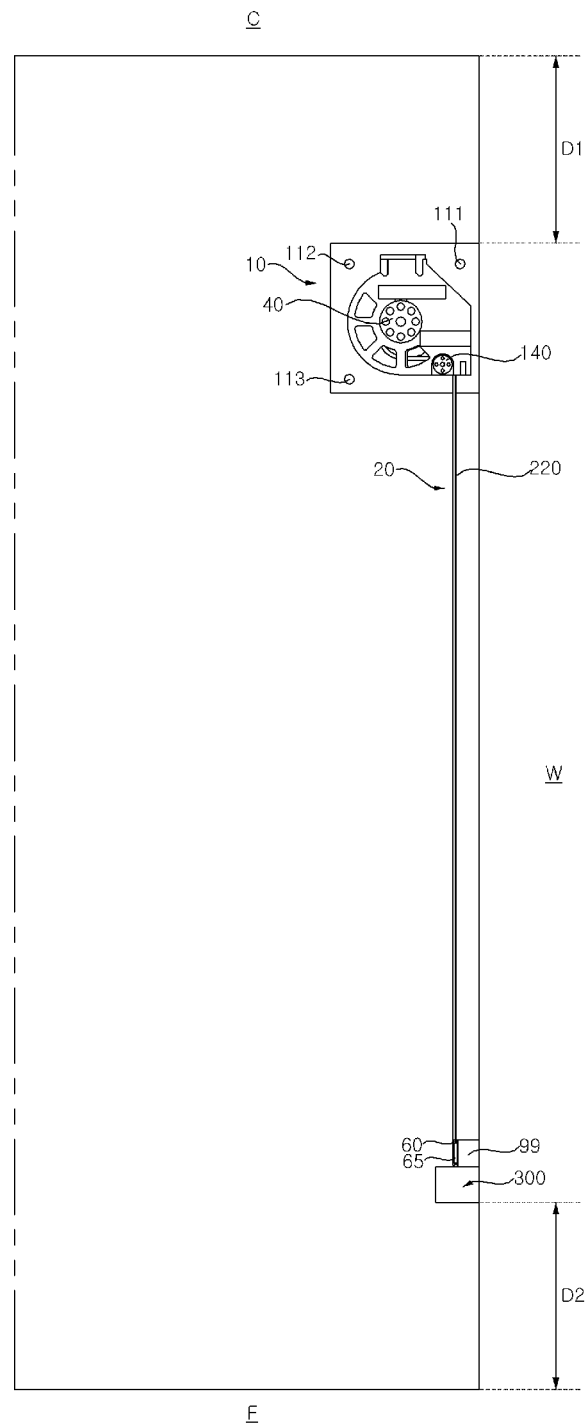

Referring to FIG. 40, the display device 10 may be installed on a wall W. The installation height of the display device 10 may be set based on the position of the display unit 20 that is completely unwound and spread from the panel roller 40. The display device 10 may be spaced apart from a ceiling C by a first distance D1. A sound unit 300 may electrically communicate with the display device 10. For example, the sound unit 300 may be electrically connected to the display device 10 via a cable, or may electrically communicate with the display device 10 through nearfield communication.

The height of the sound unit 300 may be spaced apart from a floor F by a second distance D2. The second distance D2 may be set so as to correspond to the lower end of the display unit 20 based on the state in which the display unit is unwound and spread from the panel roller 40. An electromagnet module 99 may be mounted on the sound unit 300. In the state in which the display unit 20 is unwound and spread from the panel roller 40, the electromagnet module 99 may be located adjacent to the rear surface of the lower end of the display unit 20. For example, the electromagnet module 99 may be located at the rear of the bottom case 60 of the display unit 20. The bottom case 60 may include iron (Fe). An electromagnet module 65 may be mounted in the bottom case 60, and a metal member 99 may be mounted at the upper part of the sound unit 300.

When the display unit 20 is unwound from the panel roller 40 and the bottom case 60 is adjacent to the upper part of the sound unit 300, operation of the electromagnet module 99 may be activated. As the operation of the electromagnet module 99 is activated, the bottom case 60 may be attracted toward the electromagnet module 99.

In accordance with an aspect of the present disclosure, provided is a display device including a flexible display panel, a panel roller, wherein the flexible display panel is wound around or unwound from the panel roller, a first pipe extending in a longitudinal direction of the panel roller, wherein the first pipe is located adjacent to the panel roller, a second pipe extending in the longitudinal direction of the panel roller, wherein the second pipe is located adjacent to the panel roller and is located opposite to the first pipe with respect to the panel roller, a third pipe extending in the longitudinal direction of the panel roller, wherein the third pipe is located adjacent to the panel roller, the first pipe and the second pipe, a guide roller extending in the longitudinal direction of the panel roller, wherein the guide roller is located opposite to the third pipe with respect to the panel roller, and a correction unit located at the first pipe and comprising a correction roller rotatable on the first pipe and a roll plate curved that is perpendicular to a longitudinal direction of the panel roller such that the roll plate is wound around or unwound from the correction roller, wherein the flexible display panel is wound around or unwound from the panel roller such that the flexible display panel passes between the first pipe and the guide roller, and wherein the roll plate is adjacent to and fixed to a lower end of the flexible display panel.

In accordance with another aspect of the present disclosure, the roll plate may be convexly curved toward the flexible display panel when the flexible display panel is extended.

In accordance with another aspect of the present disclosure, the roll plate may further include a flat surface portion forming a middle of the roll plate, a first curved surface portion forming one side of the roll plate and located adjacent to the flat surface portion, and a second curved surface portion forming another side of the roll plate and is located opposite to the first curved surface portion with respect to the flat surface portion.

In accordance with another aspect of the present disclosure, the display device may further include a module cover extending in the longitudinal direction of the panel roller, wherein the module cover comprises a plurality of segments arranged at a rear surface of the flexible display panel in a vertical direction with respect to the flexible display panel, wherein the flexible display panel and the module cover may be wound around or unwound from the panel roller.

In accordance with another aspect of the present disclosure, at least a portion of the flat surface portion of the roll plate may be in contact with the module cover.

In accordance with another aspect of the present disclosure, the display devices may further include a bottom case located at lower ends of the flexible display panel and the module cover, wherein the bottom case may be coupled to the flexible display panel or the module cover, wherein a distal end of the roll plate may be fixed to the bottom case.

In accordance with another aspect of the present disclosure, the display devices may further include a fixing bar coupled to one surface of the bottom case, wherein the distal end of the roll plate may be inserted between the bottom case and the fixing bar.

In accordance with another aspect of the present disclosure, the correction unit may further include a first correction unit located adjacent to one end of the panel roller, and a second correction unit located adjacent to another end of the panel roller such that a distance between the first correction unit and the second correction unit may be less than a width of the flexible display panel.

In accordance with another aspect of the present disclosure, a distance between the first pipe and the second pipe may be greater than a distance between the third pipe and the guide roller.

In accordance with another aspect of the present disclosure, the flexible display panel may move downwards in response to being unwound from the panel roller and may move upwards in response to being wound around the panel roller.

In accordance with another aspect of the present disclosure, provided is a display device including a flexible display panel, a panel roller, wherein the flexible display panel is wound around or unwound from the panel roller, a first pipe extending in a longitudinal direction of the panel roller, wherein the first pipe is located adjacent to the panel roller, a second pipe extending in the longitudinal direction of the panel roller, wherein the second pipe is located adjacent to the panel roller and is located opposite to the first pipe with respect to the panel roller, a bottom case located adjacent to and coupled to a lower end of the flexible display panel, and an electromagnet module mounted in the bottom case.

In accordance with another aspect of the present disclosure, the display device may further include a third pipe extending in the longitudinal direction of the panel roller, wherein the third pipe is located adjacent to the panel roller, the first pipe, and the second pipe, and a guide roller extending in the longitudinal direction of the panel roller, wherein the guide roller is located opposite to the third pipe with respect to the panel roller, wherein the flexible display panel may be wound around or unwound from the panel roller such that the flexible display panel passes between the first pipe and the guide roller.

In accordance with another aspect of the present disclosure, the flexible display panel may move downwards while being unwound from the panel roller and may move upwards while being wound around the panel roller.

As is apparent from the above description, a display device according to the present disclosure has the following effects.

According to at least one of the embodiments of the present disclosure, it is possible to secure structural rigidity for preventing drooping of a display device.

According to at least one of the embodiments of the present disclosure, it is possible to secure structural rigidity for preventing twisting of the display device.

According to at least one of the embodiments of the present disclosure, it is possible to prevent bending of a flexible display panel.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
  a flexible display panel;
  a panel roller, wherein the flexible display panel is wound around or unwound from the panel roller;
  a first pipe extending in a longitudinal direction of the panel roller, wherein the first pipe is located adjacent to the panel roller;
  a second pipe extending in the longitudinal direction of the panel roller, wherein the second pipe is located adjacent to the panel roller and is located opposite to the first pipe with respect to the panel roller;
  a third pipe extending in the longitudinal direction of the panel roller, wherein the third pipe is located adjacent to the panel roller, the first pipe and the second pipe;
  a guide roller extending in the longitudinal direction of the panel roller, wherein the guide roller is located opposite to the third pipe with respect to the panel roller; and
  a correction unit located at the first pipe and comprising a correction roller rotatable on the first pipe and a roll plate curved that is perpendicular to a longitudinal direction of the panel roller such that the roll plate is wound around or unwound from the correction roller, wherein
  the flexible display panel is wound around or unwound from the panel roller such that the flexible display panel passes between the first pipe and the guide roller, and wherein the roll plate is adjacent to and fixed to a lower end of the flexible display panel, wherein the roll plate further comprises:
  a flat surface portion forming a middle of the roll plate;
  a first curved surface portion forming one side of the roll plate and located adjacent to the flat surface portion; and
  a second curved surface portion forming another side of the roll plate and is located opposite to the first curved surface portion with respect to the flat surface portion.

2. The display device of claim 1, wherein the roll plate is convexly curved toward the flexible display panel when the flexible display panel is extended.

3. The display device of claim 1, further comprising a module cover extending in the longitudinal direction of the panel roller, wherein the module cover comprises a plurality of segments arranged at a rear surface of the flexible display panel in a vertical direction with respect to the flexible display panel, wherein the flexible display panel and the module cover are wound around or unwound from the panel roller.

4. The display device of claim 3, wherein at least a portion of the flat surface portion of the roll plate is in contact with the module cover.

5. The display device of claim 4, further comprising a bottom case located at lower ends of the flexible display panel and the module cover, wherein the bottom case is coupled to the flexible display panel or the module cover, wherein a distal end of the roll plate is fixed to the bottom case.

6. The display device of claim 5, further comprising a fixing bar coupled to one surface of the bottom case, wherein the distal end of the roll plate is inserted between the bottom case and the fixing bar.

7. The display device of claim 1, wherein the correction unit further comprises:
  a first correction unit located adjacent to one end of the panel roller; and
  a second correction unit located adjacent to another end of the panel roller such that
  a distance between the first correction unit and the second correction unit is less than a width of the flexible display panel.

8. The display device of claim 1, wherein a distance between the first pipe and the second pipe is greater than a distance between the third pipe and the guide roller.

9. The display device of claim 1, wherein the flexible display panel moves downwards in response to being unwound from the panel roller and moves upwards in response to being wound around the panel roller.

10. The display device of claim 1, further comprising:
a bottom case located adjacent to and coupled to a lower end of the flexible display panel; and
an electromagnet module mounted in the bottom case.

* * * * *